(12) United States Patent
Nishikawa et al.

(10) Patent No.: US 11,587,943 B2
(45) Date of Patent: *Feb. 21, 2023

(54) BONDED DIE ASSEMBLY USING A FACE-TO-BACK OXIDE BONDING AND METHODS FOR MAKING THE SAME

(71) Applicant: SANDISK TECHNOLOGIES LLC, Addison, TX (US)

(72) Inventors: Masatoshi Nishikawa, Nagoya (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 144 days.

This patent is subject to a terminal disclaimer.

(21) Appl. No.: 17/009,374

(22) Filed: Sep. 1, 2020

(65) Prior Publication Data

US 2020/0402990 A1    Dec. 24, 2020

Related U.S. Application Data

(63) Continuation of application No. 16/385,010, filed on Apr. 16, 2019, now Pat. No. 10,797,062.

(51) Int. Cl.
*H01L 25/065* (2006.01)
*H01L 27/11556* (2017.01)
(Continued)

(52) U.S. Cl.
CPC .... *H01L 27/11556* (2013.01); *H01L 23/5384* (2013.01); *H01L 23/5385* (2013.01);
(Continued)

(58) Field of Classification Search
CPC .............................................. H01L 27/11582
See application file for complete search history.

(56) References Cited

U.S. PATENT DOCUMENTS 5,915,167 A    6/1999 Leedy
8,563,403 B1    10/2013 Farooq et al.
(Continued)

OTHER PUBLICATIONS

U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.

(Continued)

*Primary Examiner* — Christopher A Johnson
(74) *Attorney, Agent, or Firm* — The Marbury Law Group PLLC

(57) ABSTRACT

A first semiconductor die includes a first substrate, first semiconductor devices, first dielectric material layers having a first silicon oxide surface as an uppermost surface and forming first metal interconnect structures. A second semiconductor die includes a second substrate, second semiconductor devices, and second dielectric material layers forming second metal interconnect structures. A handle substrate is attached to a topmost surface of the second semiconductor die. The second substrate is thinned, and a second silicon oxide surface is provided as a bottommost surface of the second semiconductor die. The second semiconductor die is bonded to the first semiconductor die by inducing oxide-to-oxide bonding between the second silicon oxide surface and the first silicon oxide surface. The handle substrate is detached, and inter-die connection via structures are formed through the second substrate and the bonding interface to contact the first metal interconnect structures. External bonding pads may be subsequently formed.

20 Claims, 40 Drawing Sheets

(51) Int. Cl.
*H01L 27/11582* (2017.01)
*H01L 23/538* (2006.01)
*H01L 23/00* (2006.01)

(52) U.S. Cl.
CPC .......... *H01L 24/48* (2013.01); *H01L 25/0657* (2013.01); *H01L 27/11582* (2013.01)

(56) References Cited

U.S. PATENT DOCUMENTS

| | | | |
|---|---|---|---|
| 9,530,790 | B1 | 12/2016 | Lu et al. |
| 10,115,681 | B1 | 10/2018 | Ariyoshi |
| 10,283,493 | B1 | 5/2019 | Nishida |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 10,629,616 | B1 | 4/2020 | Kai et al. |
| 10,700,028 | B2 | 6/2020 | Nishida |
| 10,714,497 | B1 | 7/2020 | Nishida et al. |
| 10,797,062 | B1 * | 10/2020 | Nishikawa .......... H01L 23/5385 |
| 2008/0191310 | A1 | 8/2008 | Wu et al. |
| 2012/0223440 | A1 * | 9/2012 | Fujita ................ H01L 21/76898 257/774 |
| 2013/0267046 | A1 * | 10/2013 | Or-Bach ........... H01L 29/66704 257/E21.214 |
| 2015/0021784 | A1 | 1/2015 | Lin |
| 2017/0062392 | A1 | 3/2017 | Cheng et al. |
| 2017/0125376 | A1 * | 5/2017 | Yeh ..................... H01L 23/5386 |
| 2017/0323919 | A1 * | 11/2017 | Kumar .............. H01L 27/14634 |
| 2018/0151589 | A1 * | 5/2018 | Shimizu ............ H01L 27/11582 |
| 2018/0350785 | A1 * | 12/2018 | Fong ........................ H01L 24/83 |
| 2019/0043868 | A1 * | 2/2019 | Hasnat .............. H01L 27/11556 |
| 2019/0221557 | A1 | 7/2019 | Kim et al. |
| 2019/0252361 | A1 | 8/2019 | Nishida |
| 2020/0066745 | A1 | 2/2020 | Yu et al. |

OTHER PUBLICATIONS

U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 28, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
Endoh, T. et al., "Novel Ultra High Density Flash Memory with A Stacked-Surrounding Gate Transistor (S-GT) Structured Cell," IEDM Proc., pp. 33-36, (2001).
Guarini, K.W. et al., "Electrical Integrity of State-of-the-Art 0.13 μm SOI CMOS Devices and Circuits Transferred for Three-Dimensional (3D) Integrated Circuit (IC) Fabrication", IEEE proceeding in IEDM 2002, 3 pages.
ISR—Notification of Transmittal of the International Search Report and Written Opinion of the International Search Authority for International Patent Application No. PCT/US2019/068639, dated Apr. 16, 2020, 15 pages.
Lu, J.J.Q., "Enabling Technologies: Wafer-to-Wafer Bonding" 2014 IEDM Short Course, 3D System Integration Technology, Dec. 14, 2014, 149 pages.

* cited by examiner

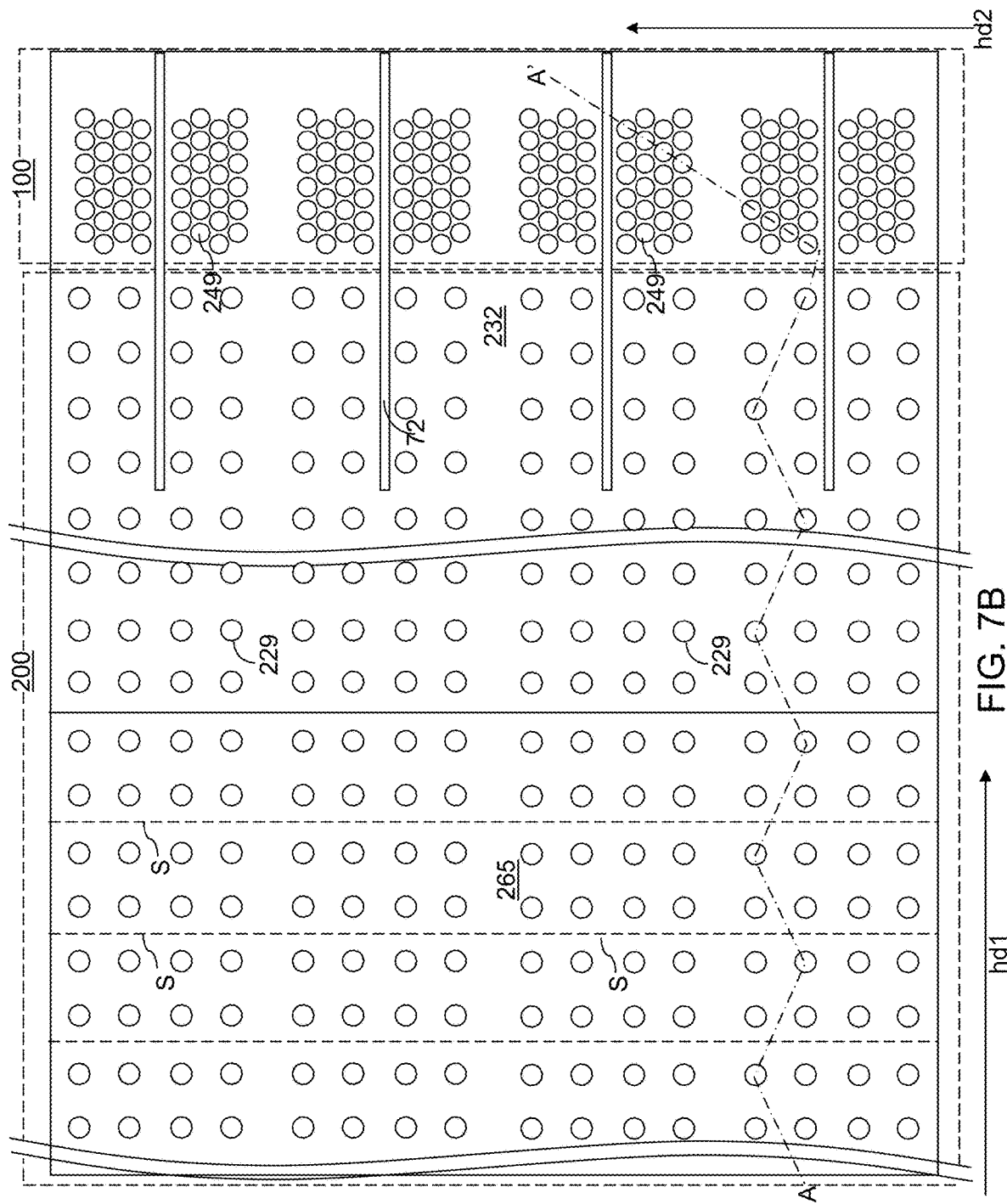

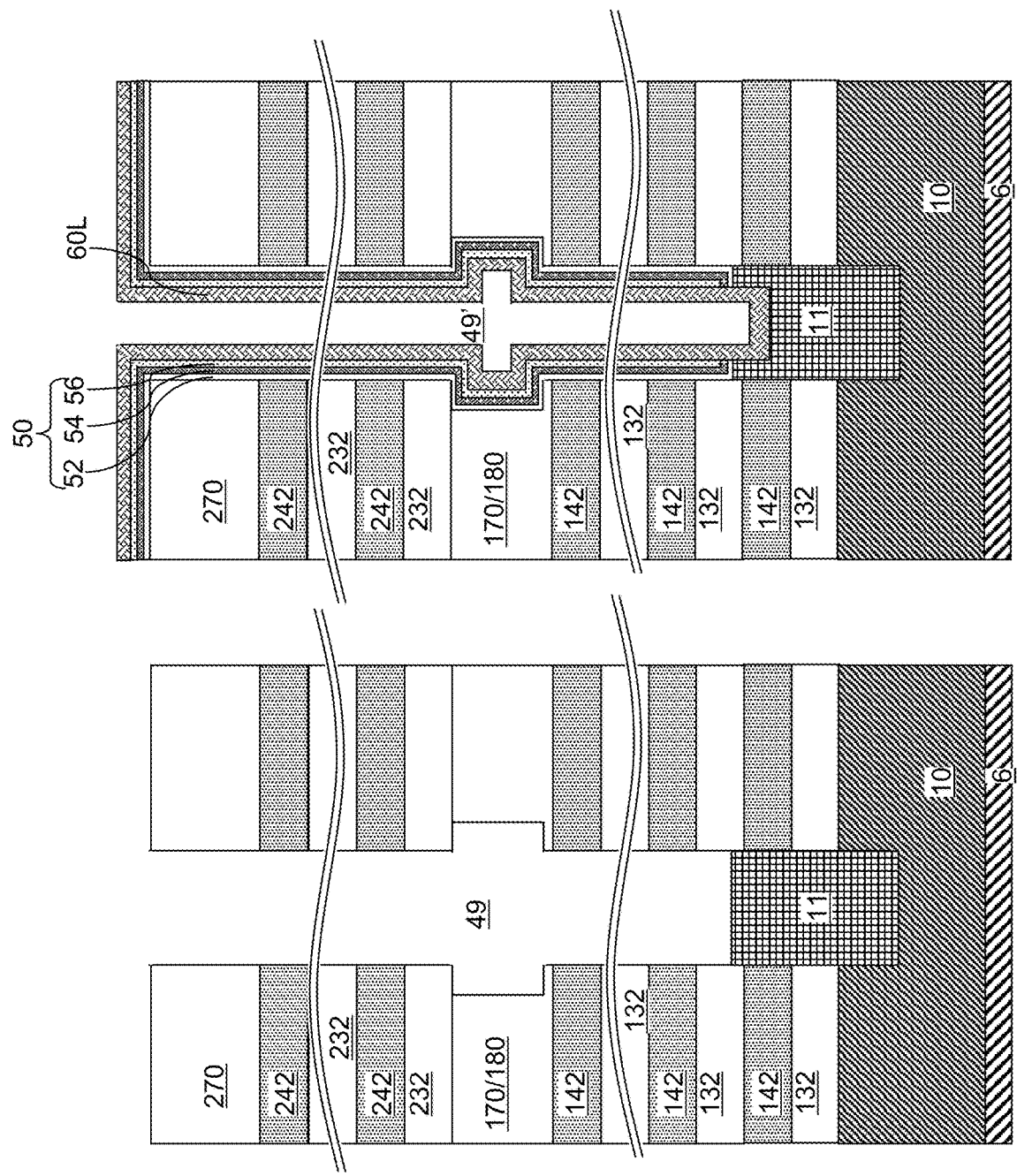

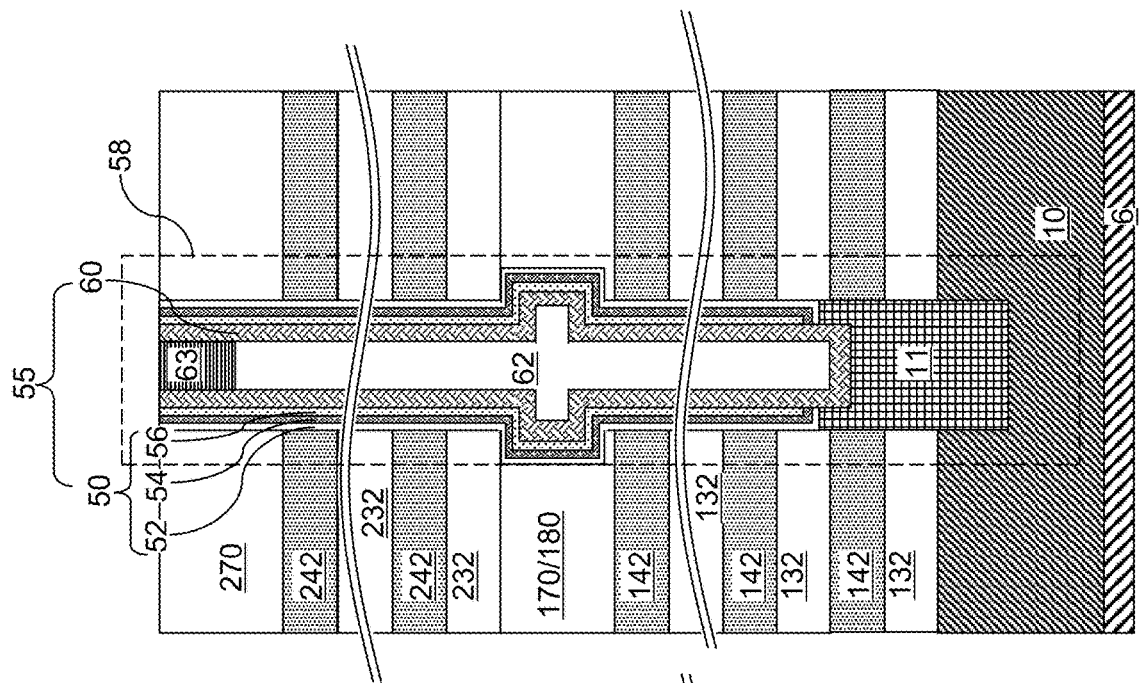
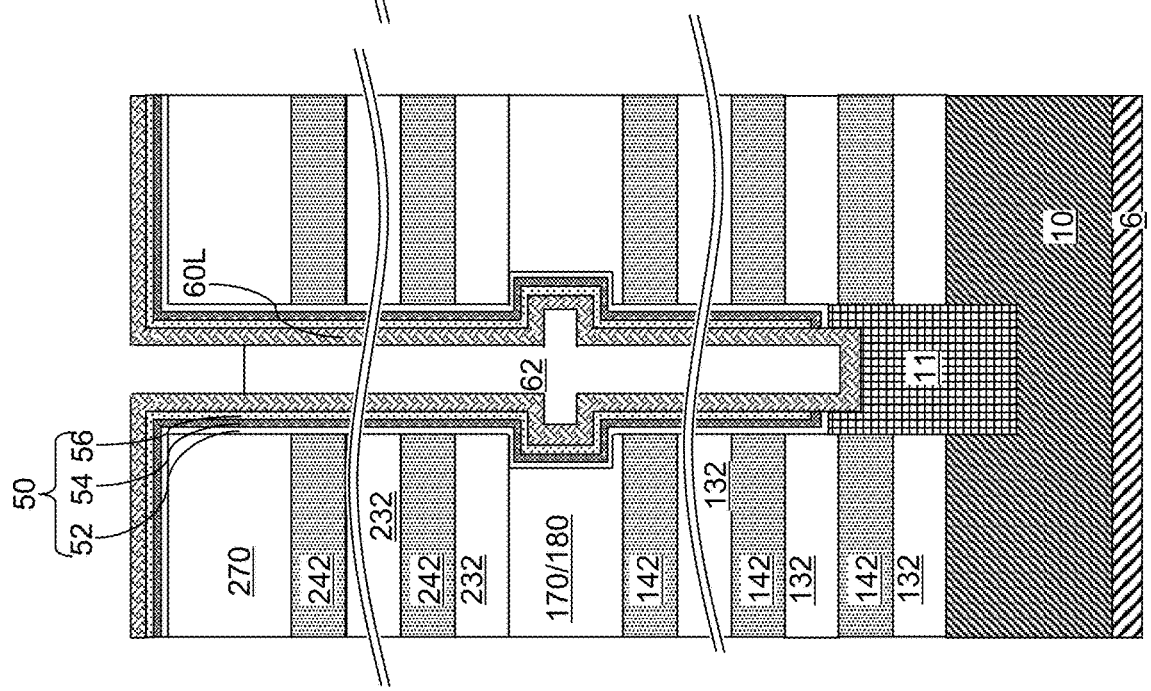

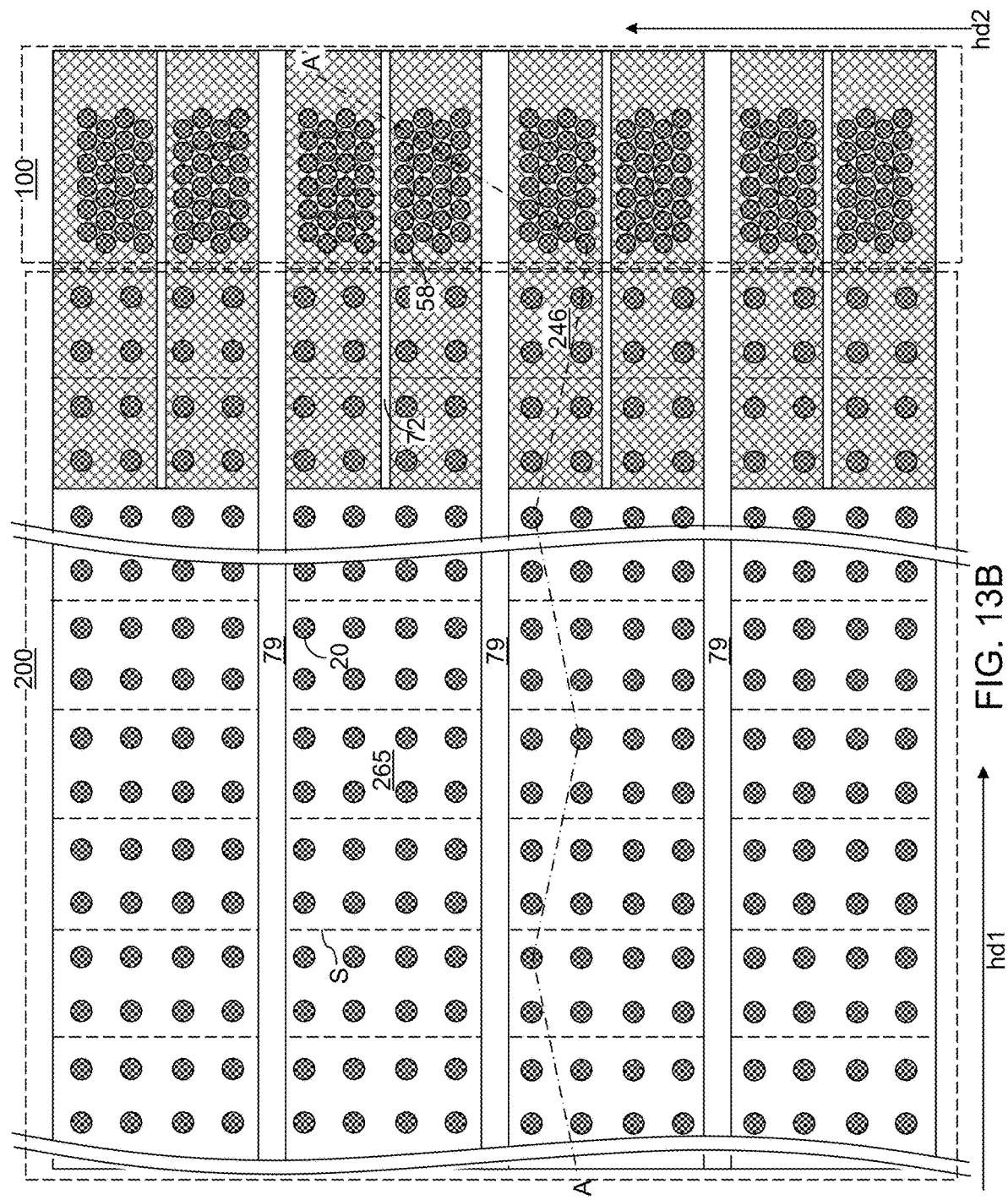

BONDED DIE ASSEMBLY USING A FACE-TO-BACK OXIDE BONDING AND METHODS FOR MAKING THE SAME

FIELD

The present disclosure relates generally to the field of semiconductor devices, and in particular, to methods for forming a bonded die assembly using a face-to-back oxide bonding and a bonded die assembly formed by the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first semiconductor die comprising a first substrate, first semiconductor devices overlying the first substrate, first dielectric material layers overlying the first semiconductor devices and having a first silicon oxide surface as an uppermost surface, and first metal interconnect structures formed within the first dielectric material layers; a second semiconductor die overlying the first semiconductor die, and comprising a second substrate, second semiconductor devices overlying a front-side surface of the second substrate, second dielectric material layers overlying the second semiconductor devices, and second metal interconnect structures formed within the second dielectric material layers, wherein a second silicon oxide surface of the second semiconductor die is located underneath the second substrate and is bonded to the first silicon oxide surface of the first semiconductor die at an oxide-to-oxide bonding interface; and inter-die connection via structures vertically extending through the second substrate and the oxide-to-oxide bonding interface, contacting a top surface of a respective first metal pad structure selected from the first metal interconnect structures, and contacting a bottom surface of a respective second metal pad structure selected from the second metal interconnect structures.

According to another embodiment of the present disclosure, a method of forming a bonded assembly is provided, which comprises: providing a first semiconductor die comprising a first substrate, first semiconductor devices overlying the first substrate, first dielectric material layers overlying the first semiconductor devices and having a first silicon oxide surface as a topmost surface, and first metal interconnect structures formed within the first dielectric material layers; providing a second semiconductor die that comprises a second substrate, second semiconductor devices overlying a front-side surface of the second substrate, second dielectric material layers overlying the second semiconductor devices, and second metal interconnect structures formed within the second dielectric material layers; attaching a handle substrate to a topmost surface of the second semiconductor die; thinning the second substrate after attaching the handle substrate to the second semiconductor die, wherein a second silicon oxide surface is provided as a bottommost surface of the second semiconductor die; bonding the second semiconductor die to the first semiconductor die by inducing oxide-to-oxide bonding between the second silicon oxide surface and the first silicon oxide surface; detaching the handle substrate from the second semiconductor die; and forming inter-die connection via structures vertically extending through the second dielectric material layers and the second substrate and contacting a top surface of a respective first metal pad structure selected from the first metal interconnect structures.

BRIEF DESCRIPTION OF THE DRAWINGS

FIG. 7B is a horizontal cross-sectional of the exemplary structure along the horizontal plane B-B' of FIG. 7A. The hinged vertical plane A-A' corresponds to the plane of the schematic vertical cross-sectional view of FIG. 7A.

FIGS. 9A-9D illustrate sequential schematic vertical cross-sectional views of a memory opening during formation of a memory opening fill structure according to an embodiment of the present disclosure.

FIG. 13B is a horizontal cross-sectional of the exemplary structure along the horizontal plane B-B' of FIG. 13A. The hinged vertical plane A-A' corresponds to the plane of the schematic vertical cross-sectional view of FIG. 13A.

DETAILED DESCRIPTION

Figure 1:
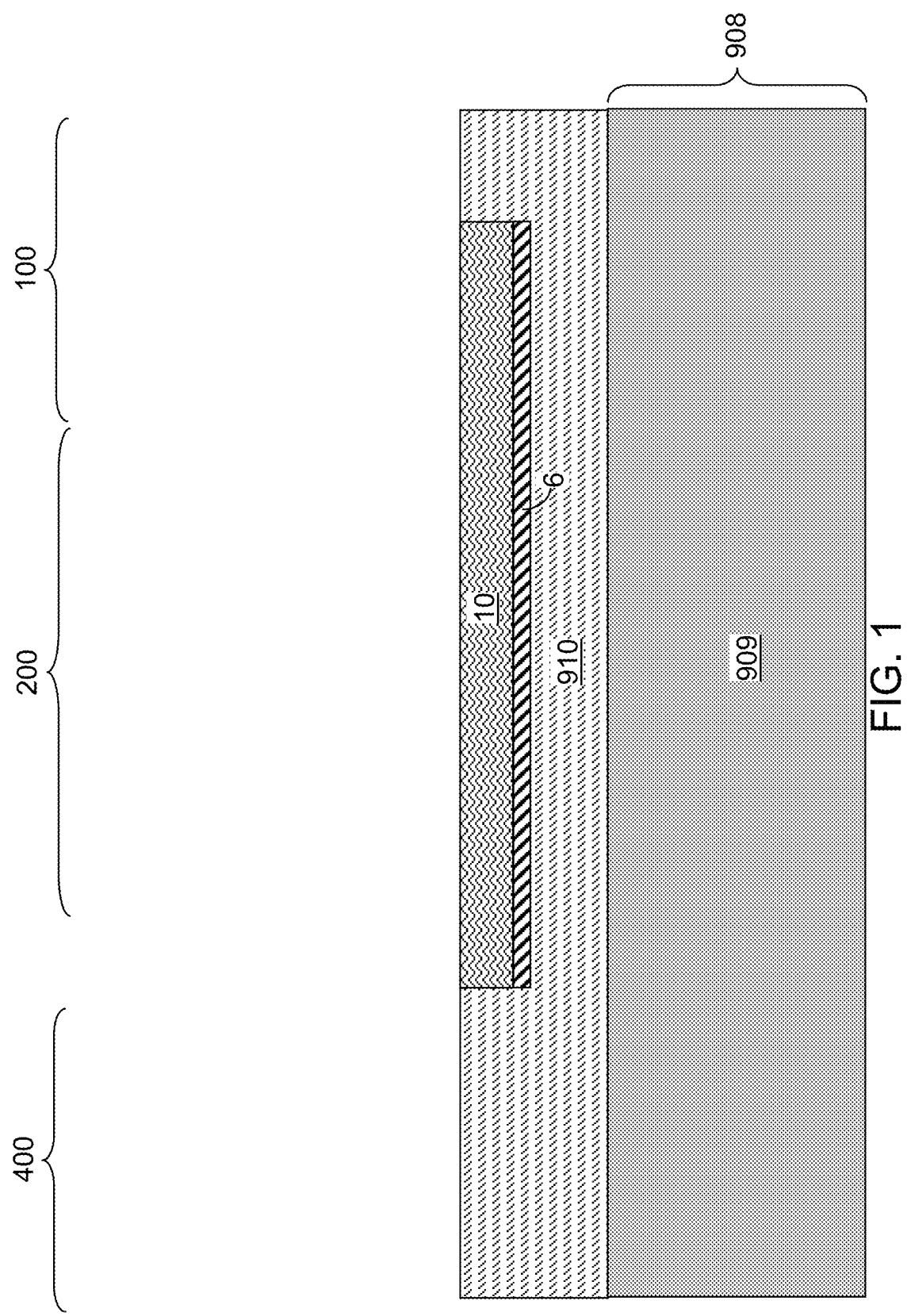
FIG. 1 is a schematic vertical cross-sectional view of an exemplary structure for forming a first semiconductor die after formation of a source-side dielectric material layer and a doped semiconductor layer on a semiconductor substrate according to an embodiment of the present disclosure.

A three-dimensional memory device includes a three-dimensional array of memory elements and a peripheral circuitry configured to control operation of the three-dimensional array of memory elements. Incorporation of the peripheral circuitry on a same die as the three-dimensional array of memory elements has the adverse effect of degradation of performance of the CMOS devices in the peripheral circuitry due to high temperature processes used to form the three-dimensional array of memory elements. The performance of a three-dimensional memory device may be enhanced by bonding a memory die to a support die including a peripheral circuitry. The embodiments of the present disclosure provide methods for forming the peripheral circuitry on semiconductor-on-insulator (SOI) substrate, such as a silicon-on-insulator substrate, bonding the support die containing the SOI substrate and the peripheral circuitry to a memory die containing a memory device, and removing the bulk substrate of the SOI substrate to expose the back of the peripheral circuitry for external electrical connections, the various embodiments of which are described herein in detail. A scalable method for bonding multiple memory die to a support die is provided. In another embodiment, a CMOS based device, such as a SRAM memory device may be formed on the SOI substrate and may be bonded to a support die that is formed on an SOI or a non-SOI substrate, followed by removal of the bulk substrate of the SOI substrate.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to an embodiment of the present disclosure is illustrated, which includes an in-process memory die. As used herein, a memory die is a semiconductor die including an array of memory elements. As such, an in-process memory ide is a structure that is subsequently modified to form a memory die.

The first exemplary structure may include a first substrate 908, which includes a semiconductor substrate layer 909. The first substrate 908 may comprise a commercially available semiconductor wafer such as a single crystalline silicon wafer. A source-side dielectric material layer 910 may be formed over the semiconductor substrate layer 909. The source-side dielectric material layer 910 may include a dielectric material such as silicon oxide. The maximum thickness of the source-side dielectric material layer 910 may be in a range from 200 nm to 3,000 nm, although lesser and greater thicknesses may also be used.

An optional metallic plate layer 6 and a source semiconductor layer 10 may be formed in the source-side dielectric material layer 910. The optional metallic plate layer 6, if present, provides a high conductivity conduction path for electrical current that flows into, along, and/or out of, the source semiconductor layer 10. The optional metallic plate layer 6 may include a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 may be a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^3$ to $2.0 \times 10^{21}/cm^3$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 200 in which stepped surfaces of electrically conductive layers embodying word lines are to be subsequently formed. A via interconnection region 400 may be provided around the memory array region 100 and the staircase region 200. In one embodiment, the top surface of the source semiconductor layer 10 may be coplanar with the top surface of the source-side dielectric material layer 910.

Figure 2:
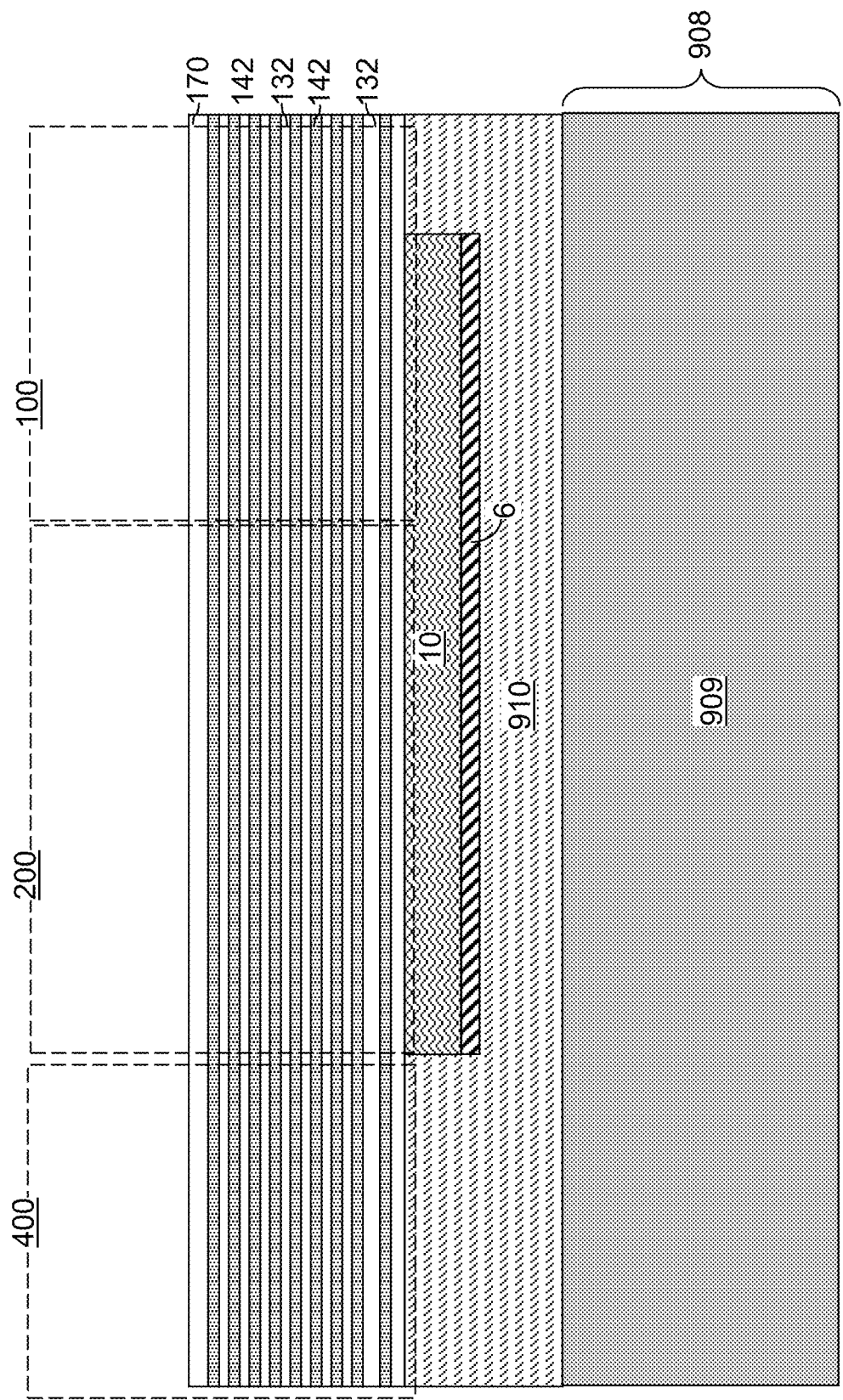
FIG. 2 is a schematic vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, in embodiments in which silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first alternating stack (132, 142). The first insulating cap layer 170 may include a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
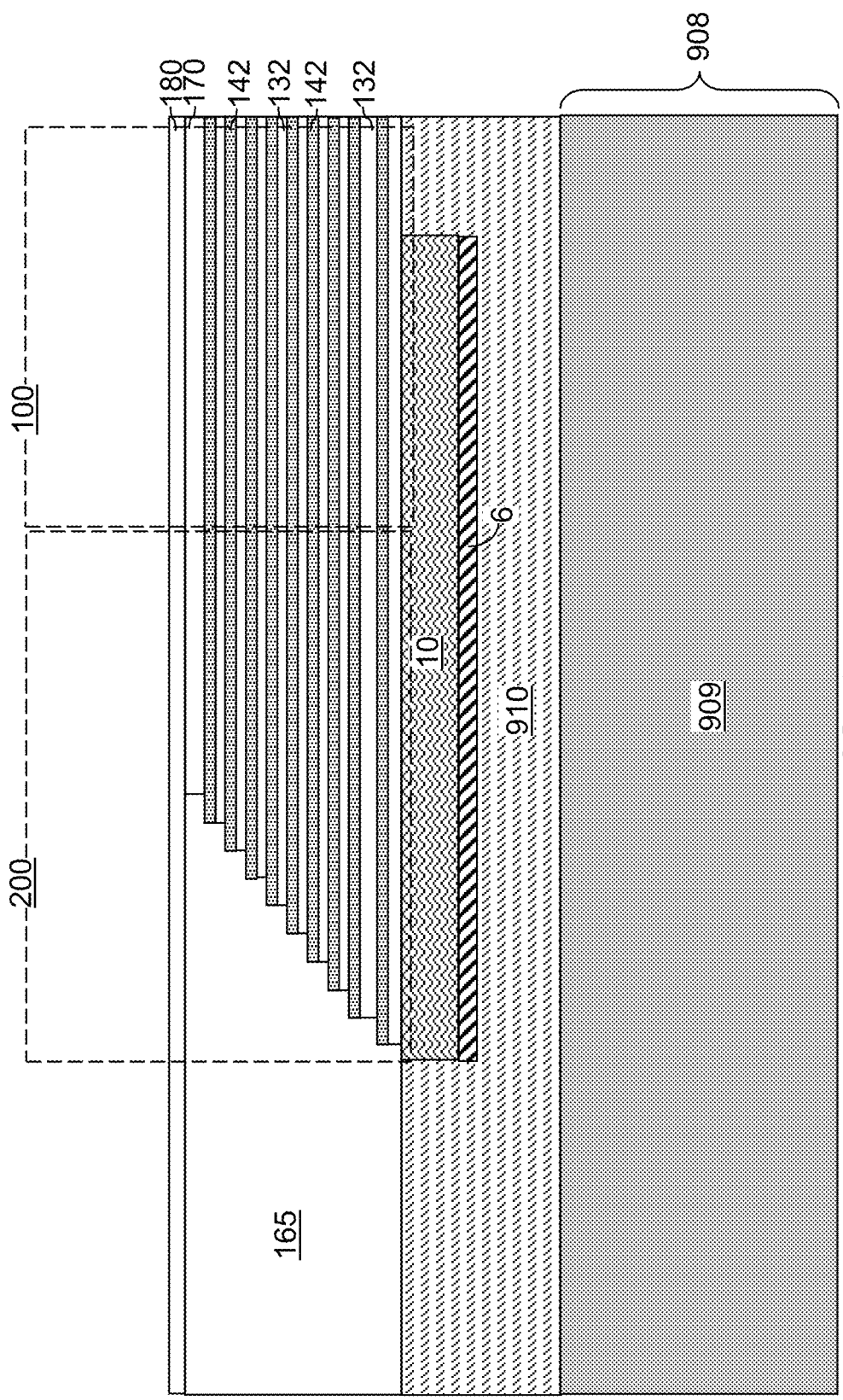
FIG. 3 is a schematic vertical cross-sectional view of the exemplary structure after patterning a first-tier staircase region, a first stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
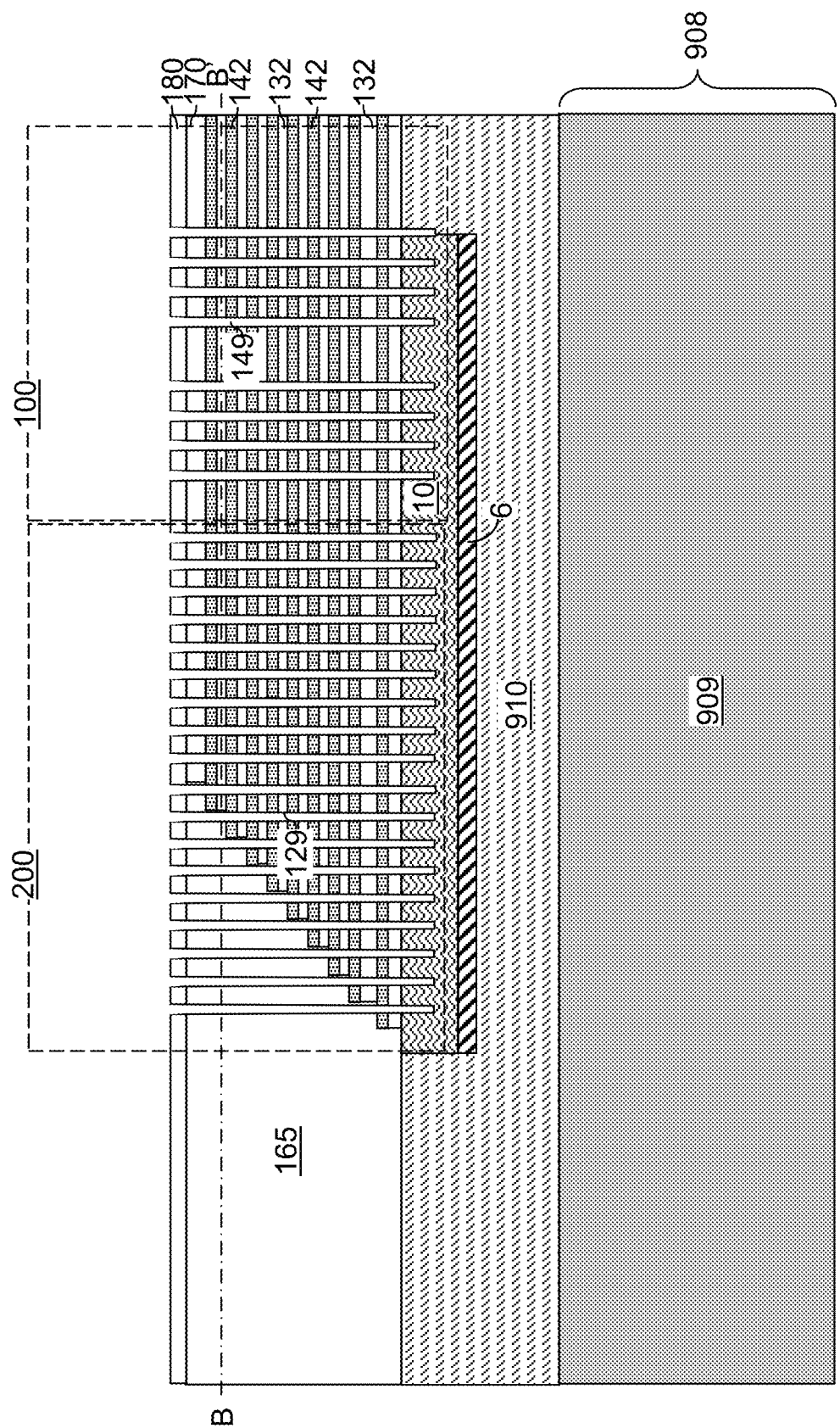
FIG. 4A is a schematic vertical cross-sectional view of the exemplary structure after formation of first-tier memory openings and first-tier support openings according to an embodiment of the present disclosure.
Figure 4B:
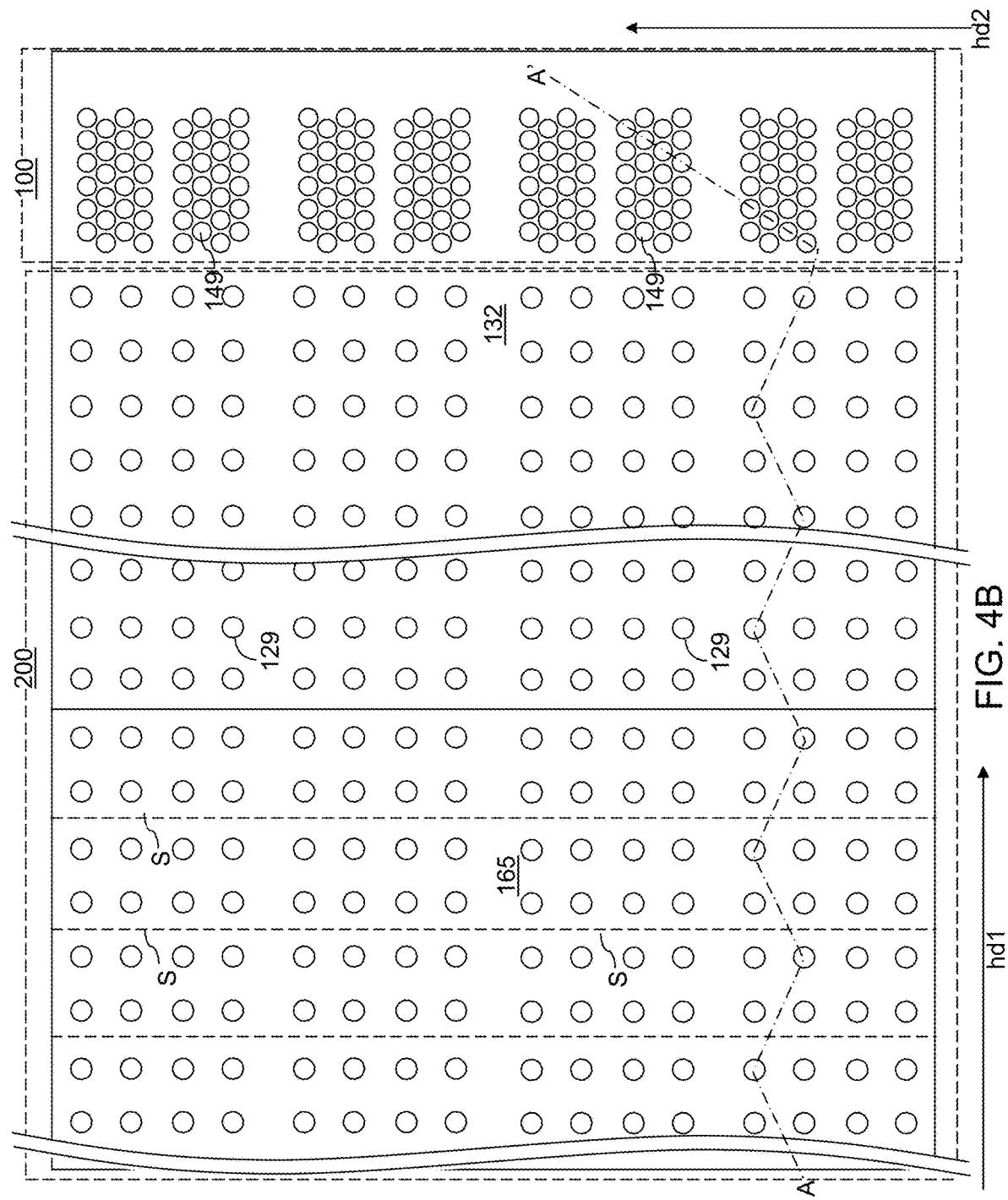
FIG. 4B is a horizontal cross-sectional view of the exemplary structure of FIG. 4A. The hinged vertical plane A-A' corresponds to the plane of the schematic vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

In an embodiment, the portions of the first-tier memory openings 149 and the first-tier support openings 129 at the level of the inter-tier dielectric layer 180 may be laterally expanded by an isotropic etch. In such embodiments, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
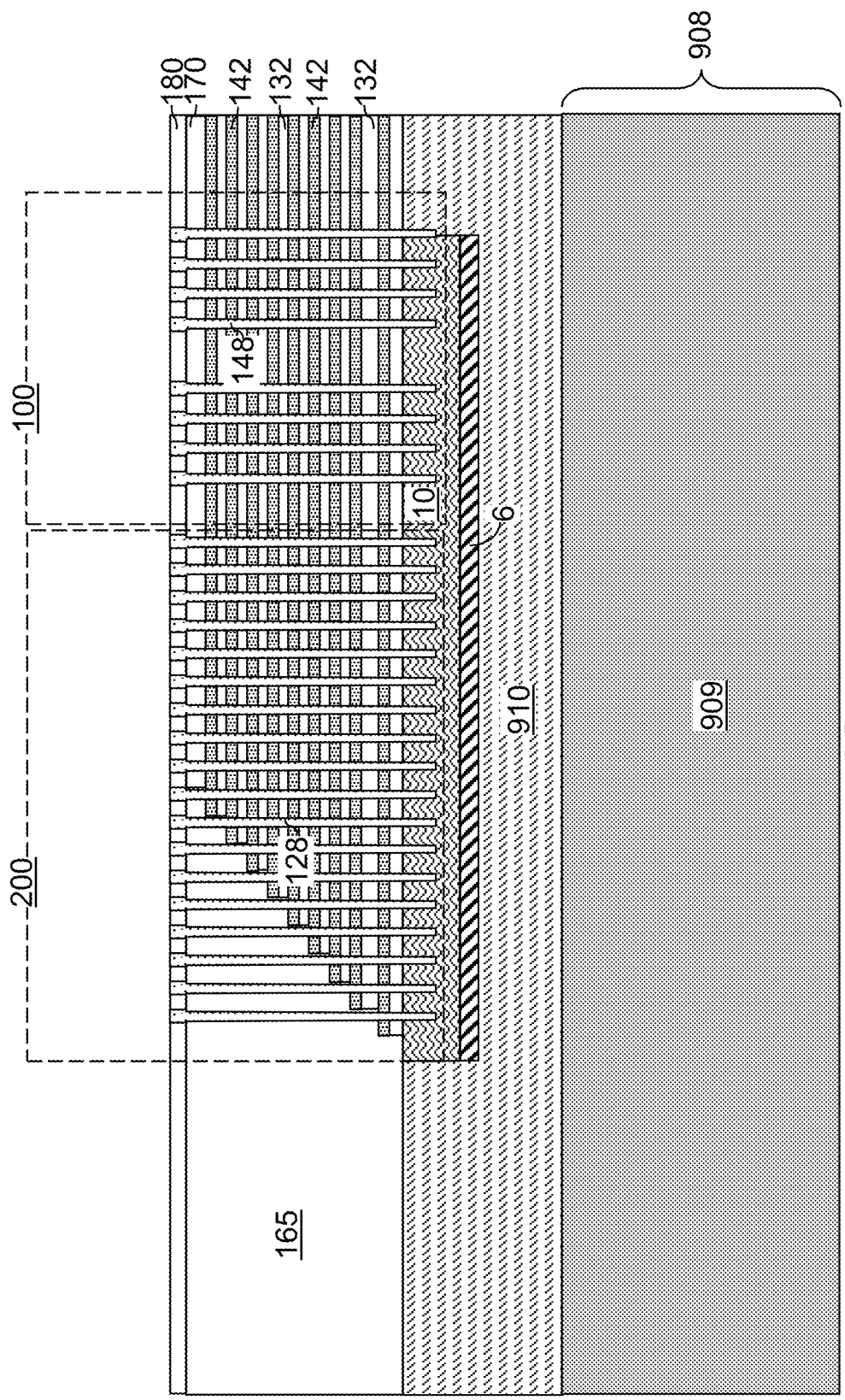
FIG. 5 is a schematic vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material may be concurrently deposited in each of the first-tier openings (149, 129). The sacrificial first-tier fill material may include a material that is to be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 may constitute a sacrificial first-tier memory opening fill portion 148. Each remaining portion of the sacrificial material in a first-tier support opening 129 may constitute a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
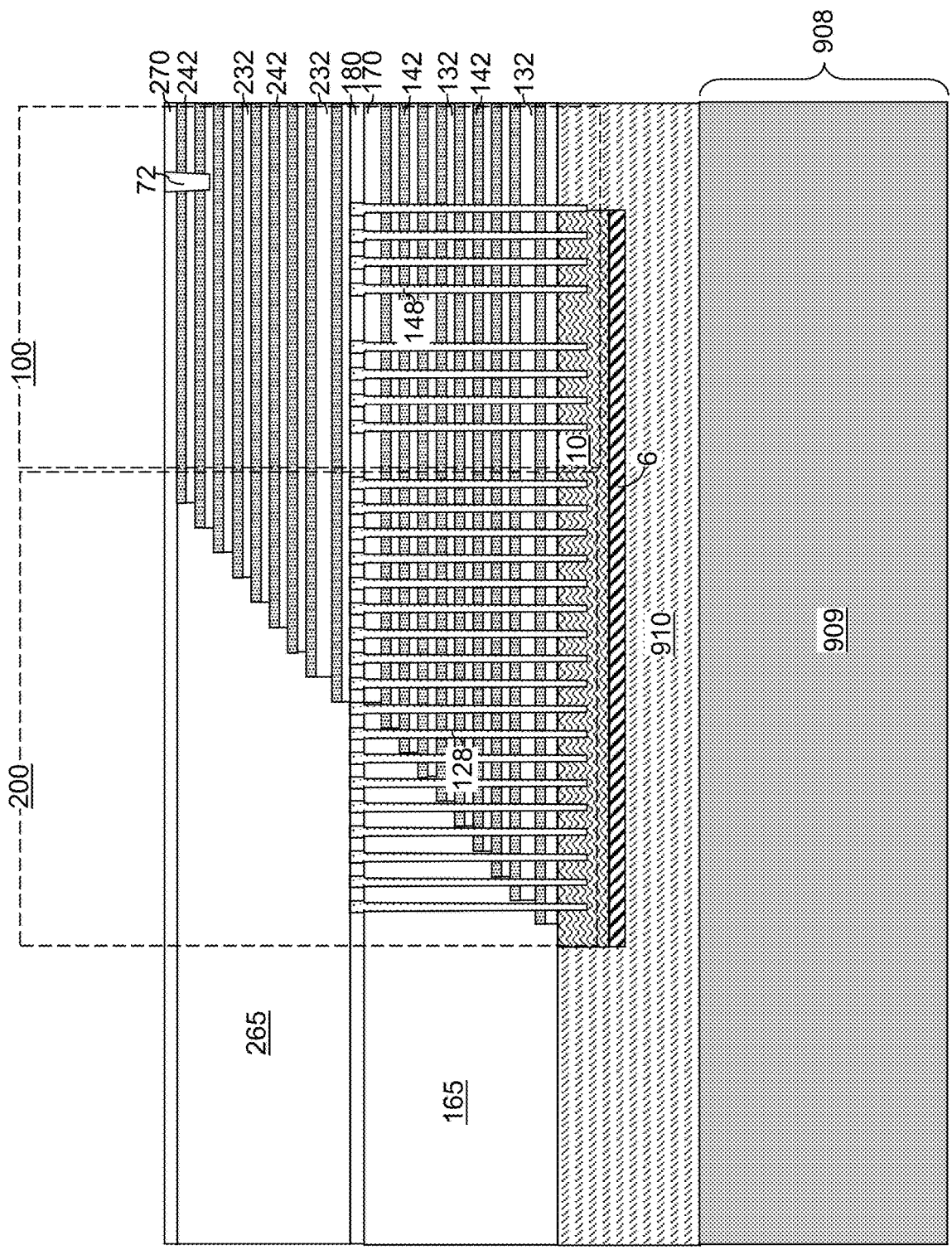
FIG. 6 is a schematic vertical cross-sectional view of the exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 may be a sacrificial material that is to be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that may be cut by the drain-select-level isolation structures 72 correspond to the levels in which drain-select-level electrically conductive layers are subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
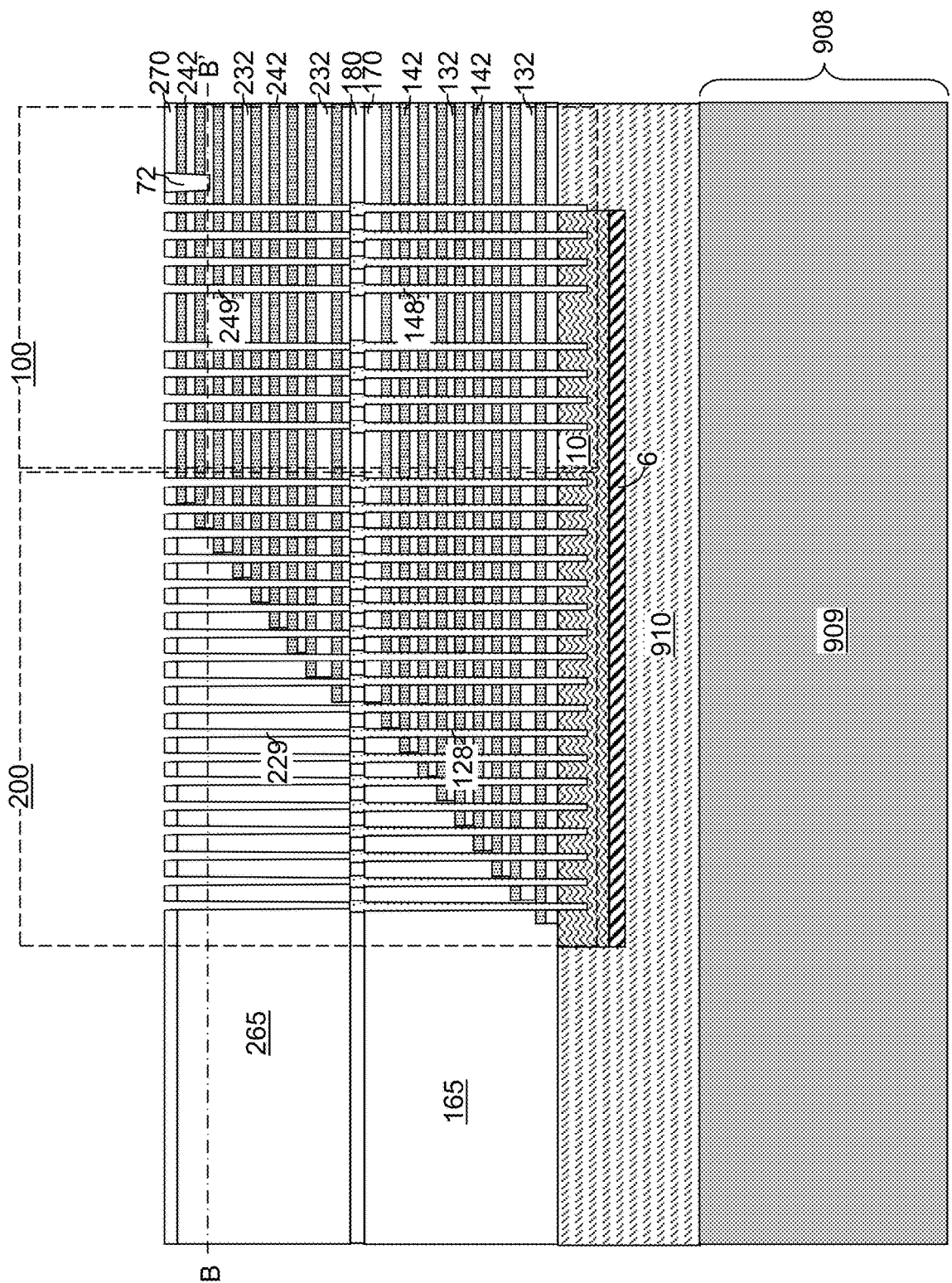
FIG. 7A is a schematic vertical cross-sectional view of the exemplary structure after formation of second-tier memory openings and second-tier support openings according to an embodiment of the present disclosure.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
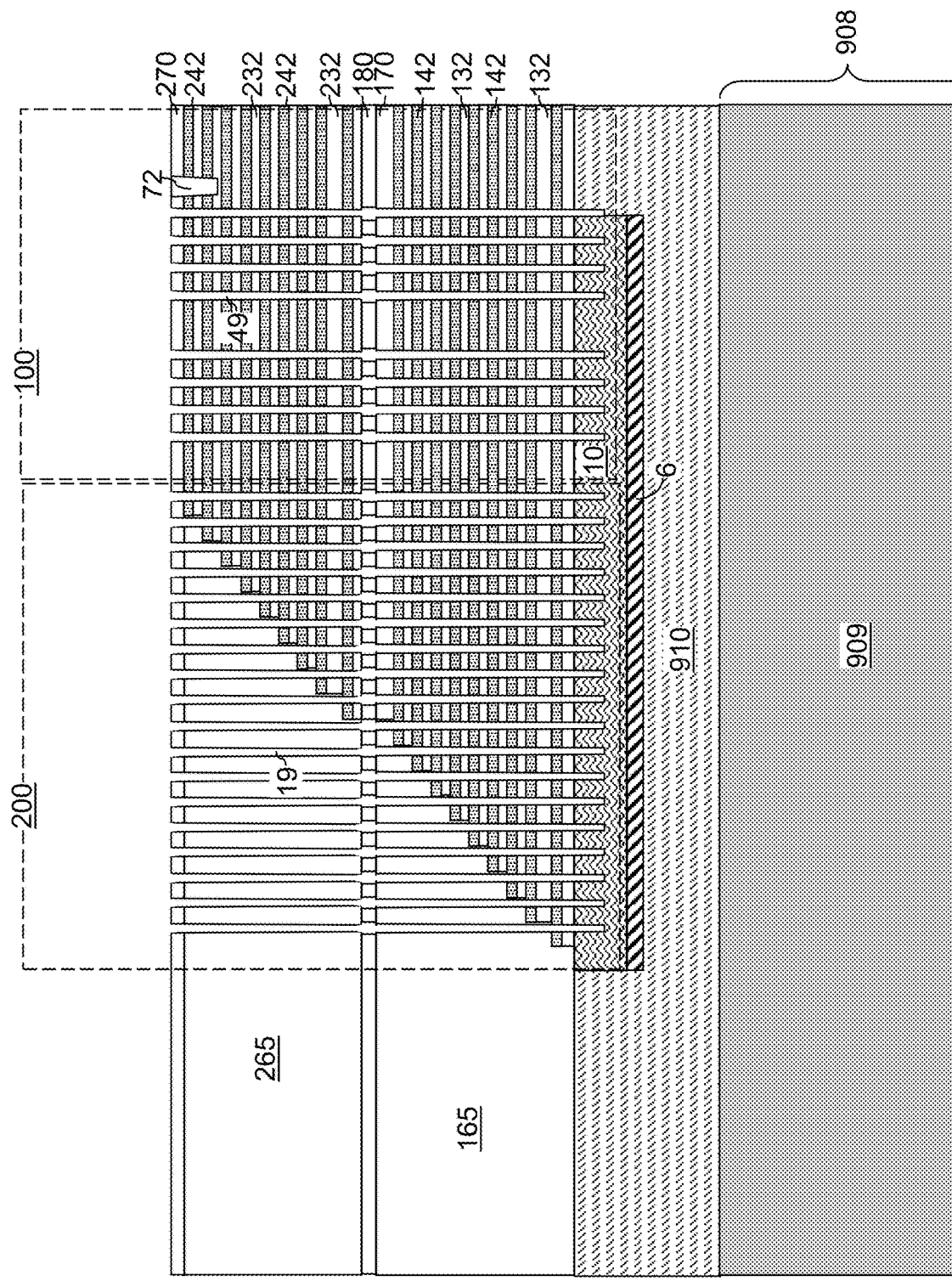
FIG. 8 is a schematic vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, may be formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 may include a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L may include a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' may be formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material may have a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material may constitute a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L may constitute a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 may collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 may constitute a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 may constitute a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
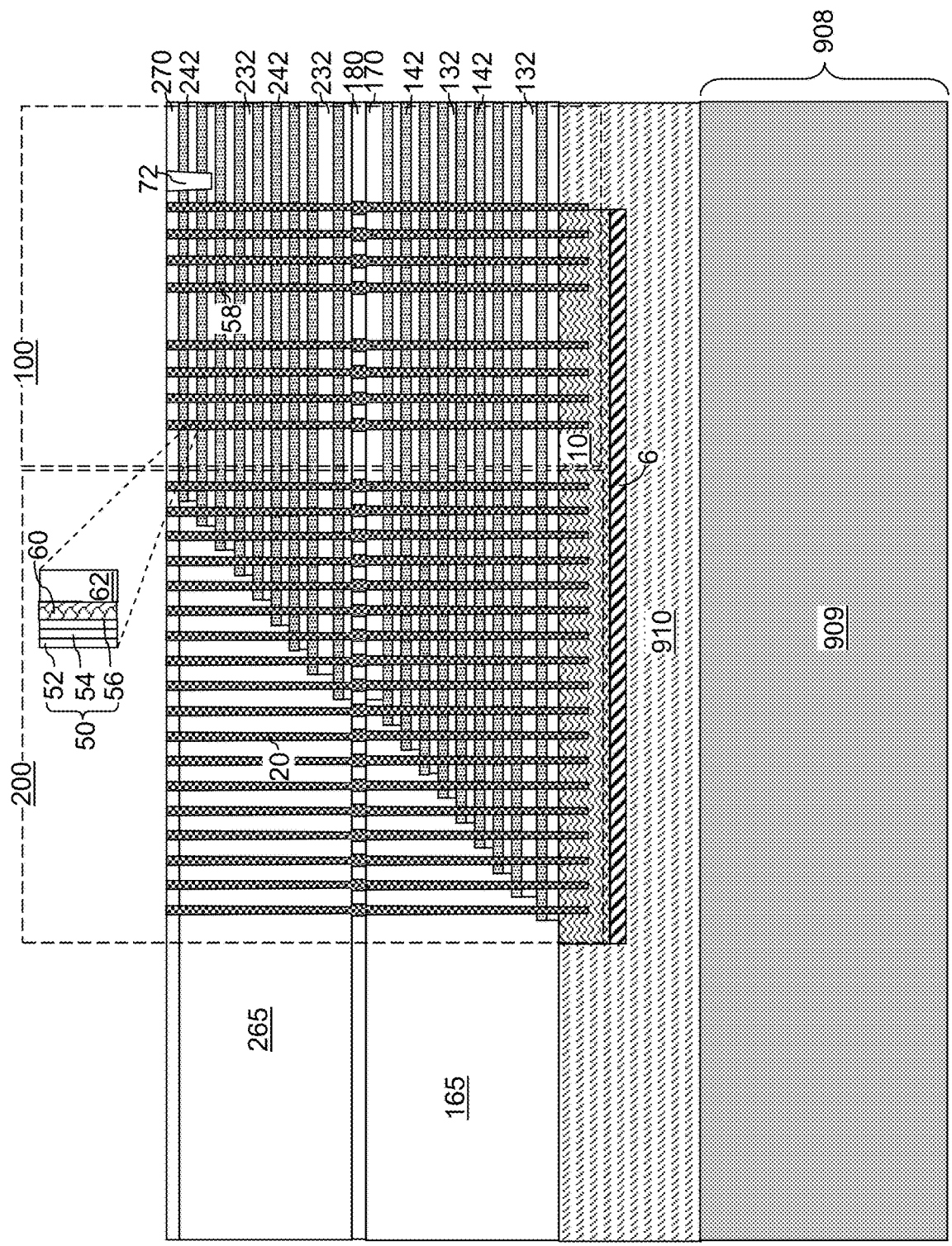
FIG. 10 is a schematic vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 may be formed in the support openings 19 concurrently with formation of the memory opening fill structures 58. Each support pillar structure 20 may have a same set of components as a memory opening fill structure 58.

Figure 11A:
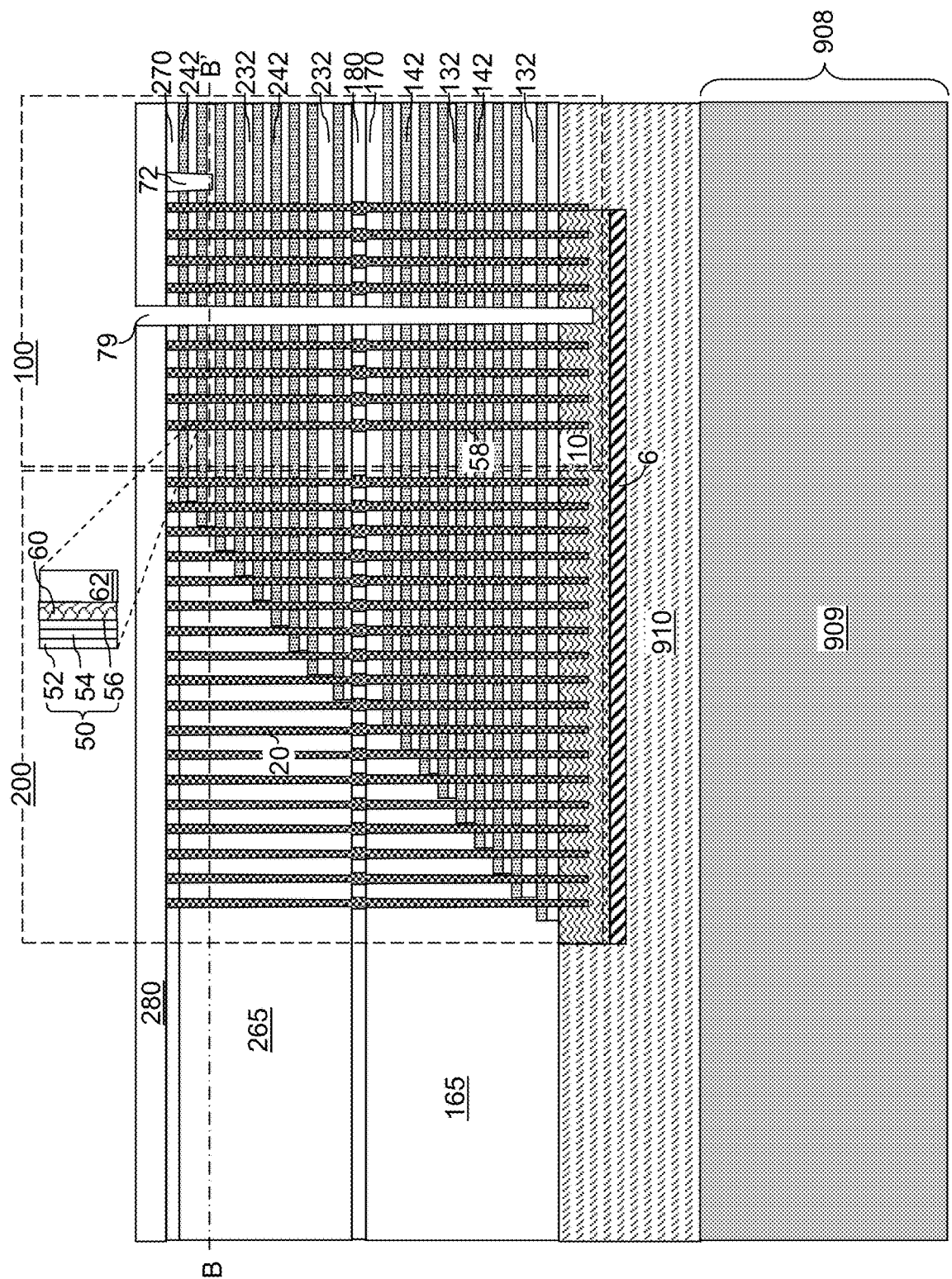
FIG. 11A is a schematic vertical cross-sectional view of the exemplary structure after formation of a first contact-level dielectric layer and backside trenches according to an embodiment of the present disclosure.
Figure 11B:
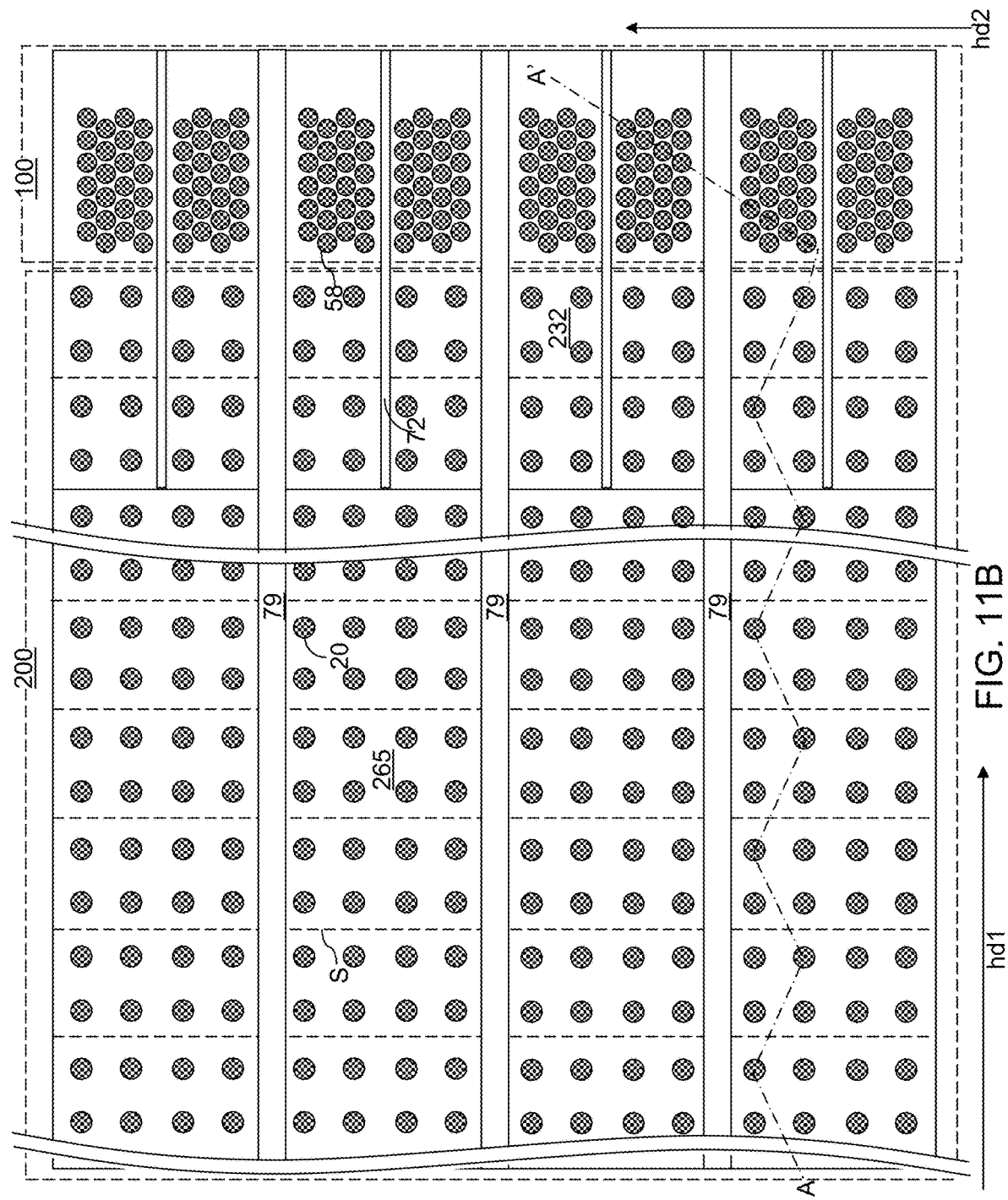
FIG. 11B is a horizontal cross-sectional of the exemplary structure along the horizontal plane B-B' of FIG. 11A. The hinged vertical plane A-A' corresponds to the plane of the schematic vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 may include a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the source semiconductor layer 10. Portions of the first contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 may be formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 12:
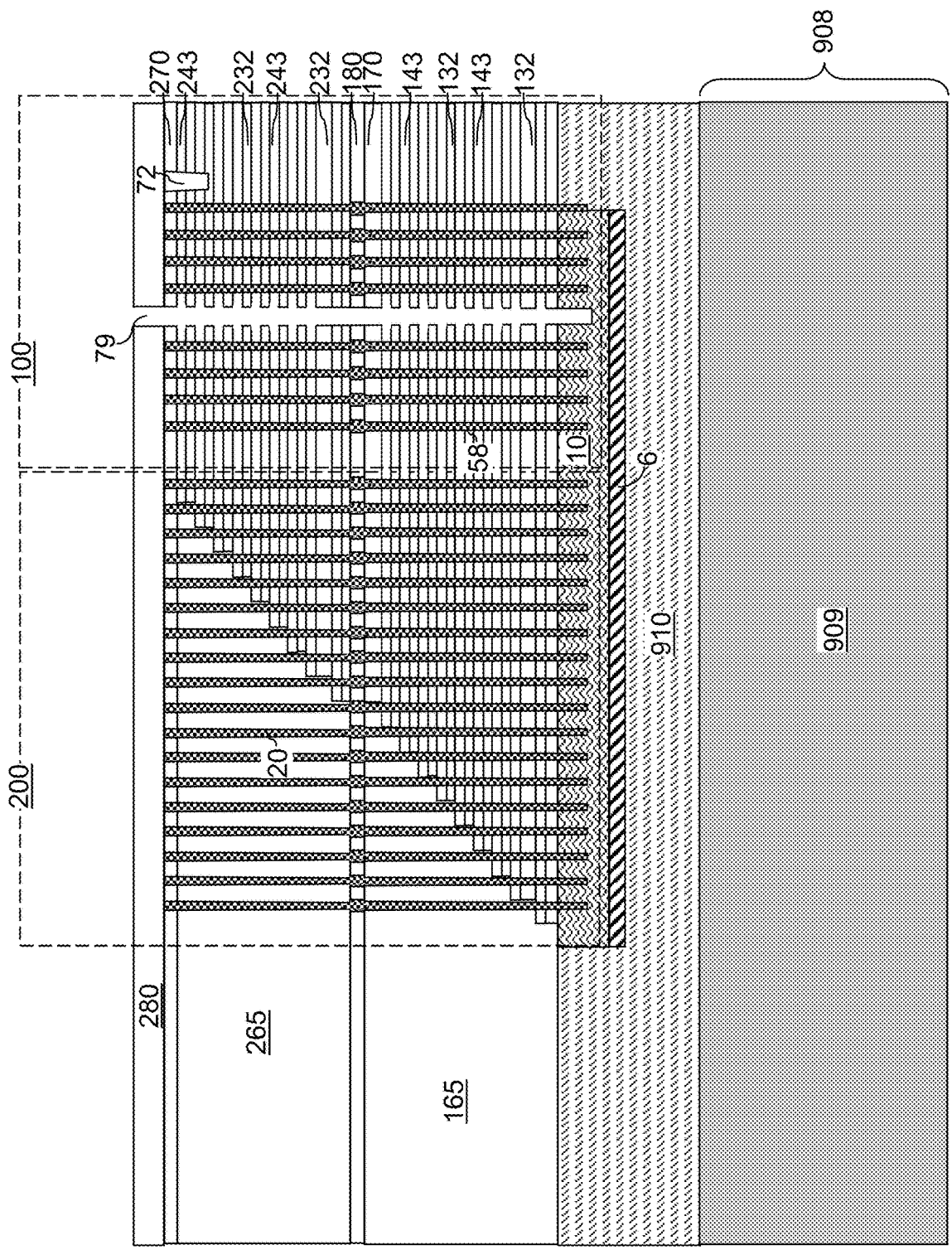
FIG. 12 is a schematic vertical cross-sectional view of the exemplary structure after formation of backside recesses according to an embodiment of the present disclosure.

Referring to FIG. 12, the sacrificial material layers (142, 242) may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) may include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
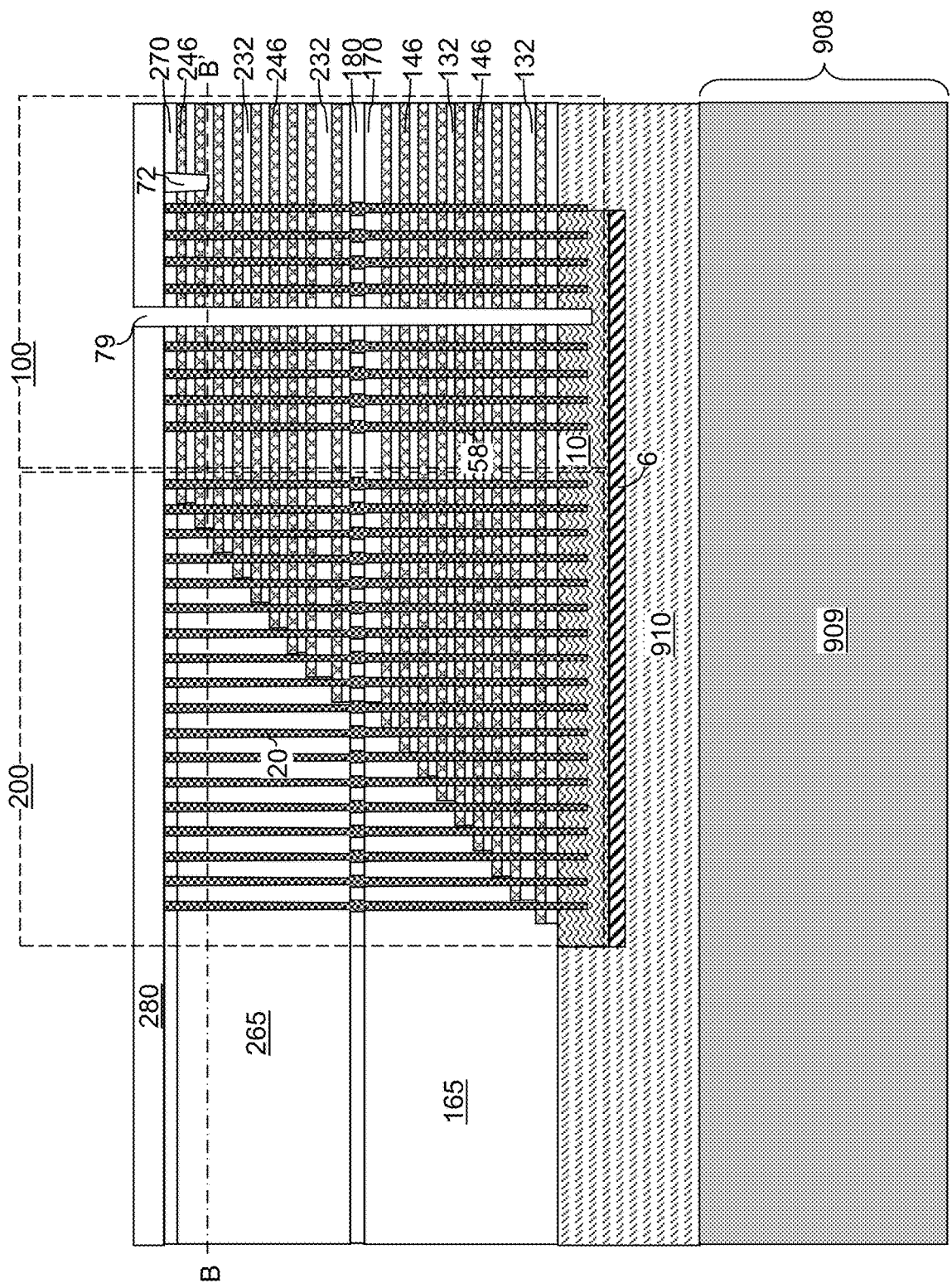
FIG. 13A is a schematic vertical cross-sectional view of the exemplary structure after formation of electrically conductive layers according to an embodiment of the present disclosure.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer may include a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) may be the control gate electrodes for a vertical memory device including the memory stack structure 55.

Each of the memory stack structures 55 may comprise a vertical stack of memory elements located at each level of the electrically conductive layers (146, 246). A subset of the electrically conductive layers (146, 246) may comprise word lines for the memory elements. The semiconductor devices in the underlying via interconnection region 400 may comprise word line switch devices configured to control a bias voltage to respective word lines. The memory-level assembly is located over the semiconductor substrate layer 909. The memory-level assembly includes at least one alternating stack (132, 146, 232, 246) and memory stack structures 55 vertically extending through the at least one alternating stack (132, 146, 232, 246).

Figure 14A:
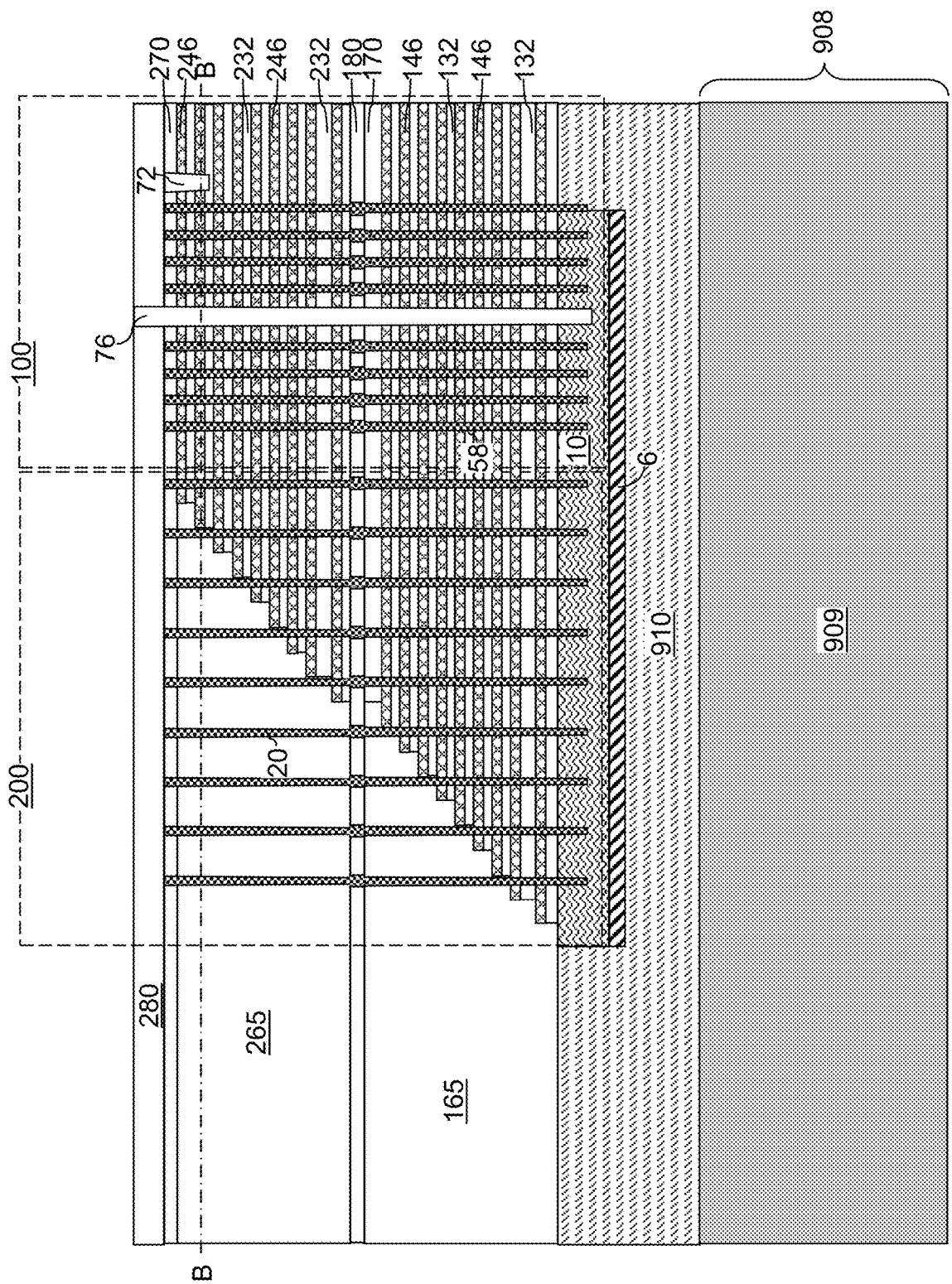
FIG. 14A is a schematic vertical cross-sectional view of the exemplary structure after formation of backside trench fill structures in the backside trenches according to an embodiment of the present disclosure.
Figure 14B:
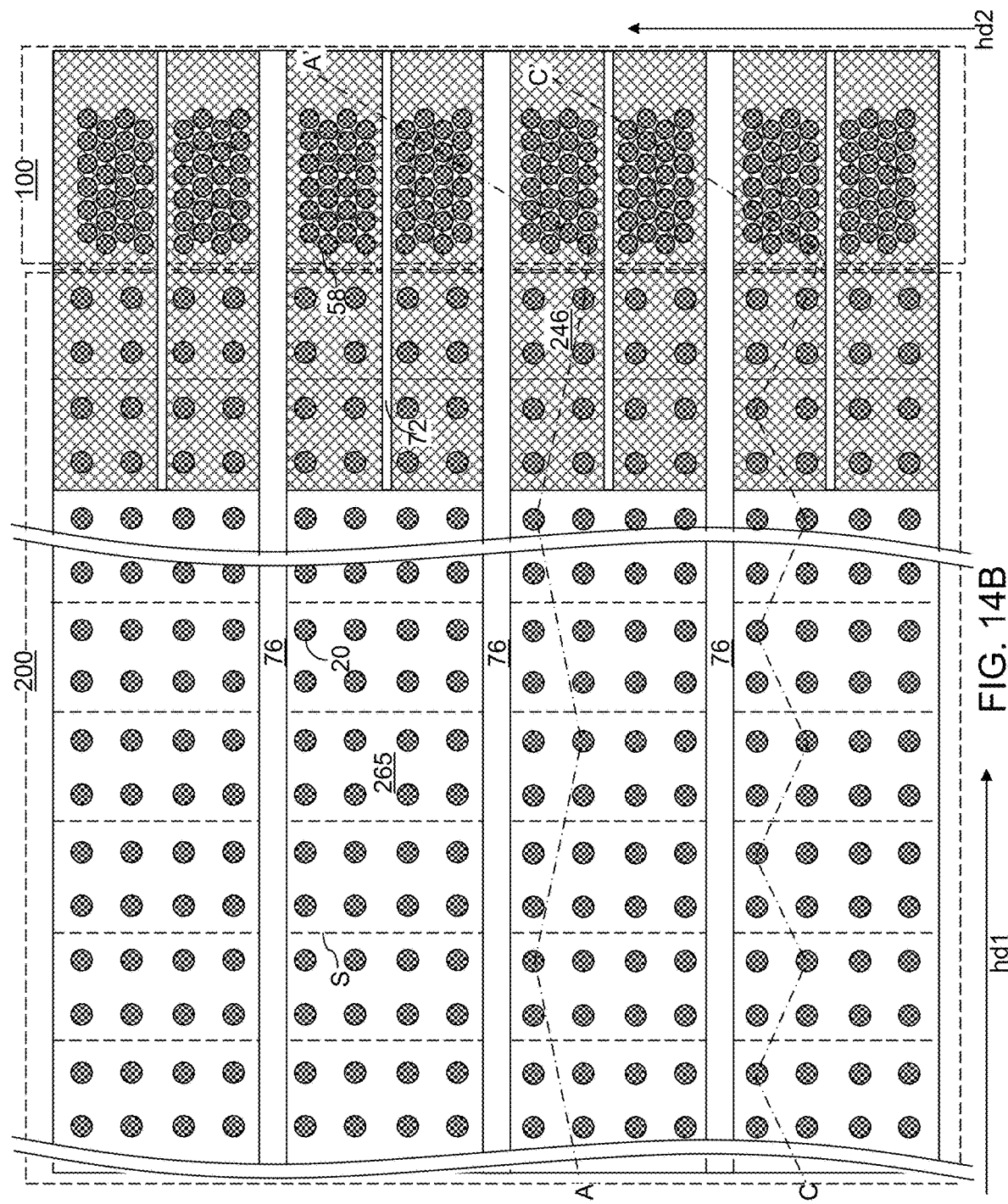
FIG. 14B is a horizontal cross-sectional of the exemplary structure along the horizontal plane B-B' of FIG. 14A. The hinged vertical plane A-A' corresponds to the plane of the schematic vertical cross-sectional view of FIG. 14A.
Figure 14C:
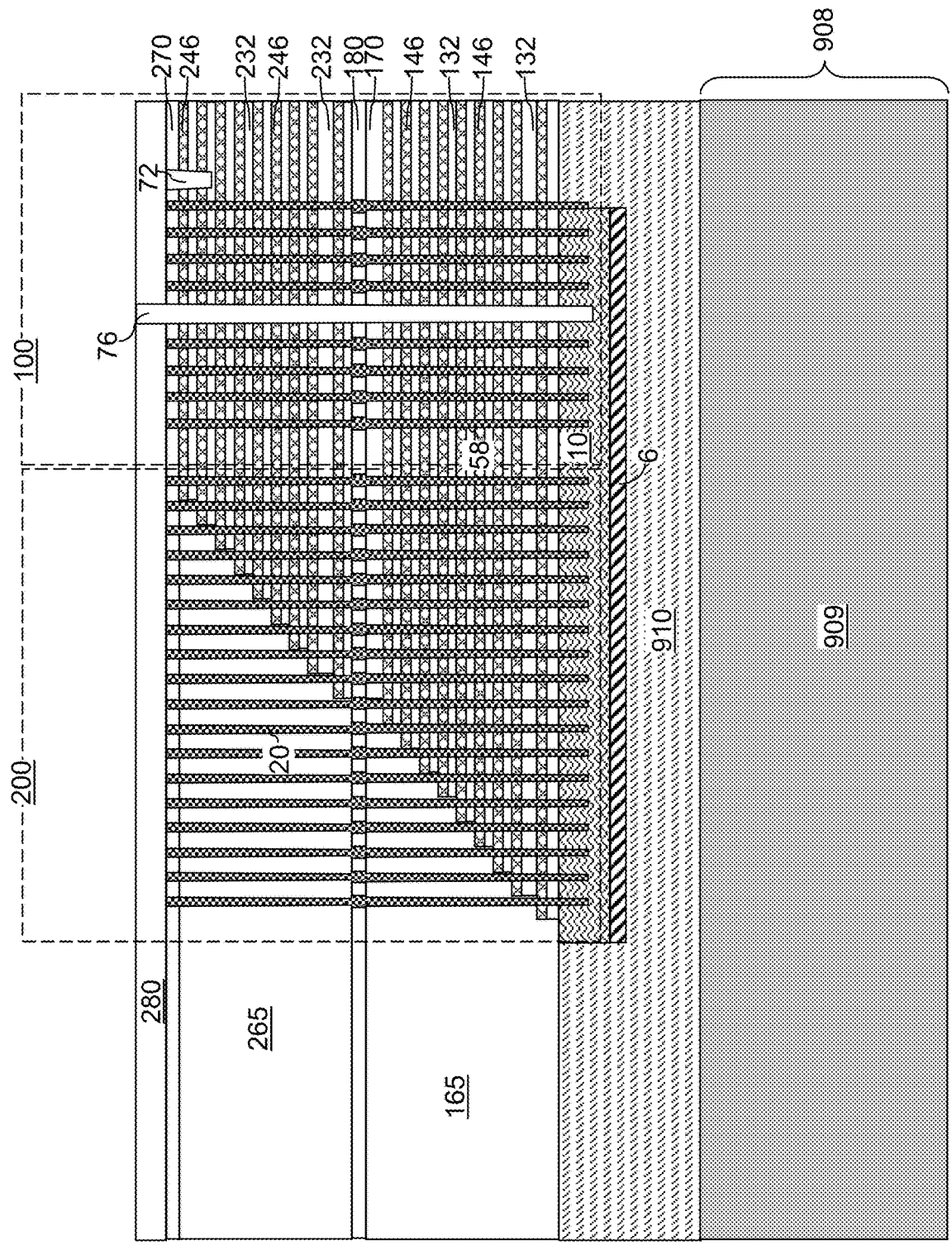
FIG. 14C is a schematic vertical cross-sectional view of the exemplary structure along the vertical plane C-C' of FIG. 14B.

Referring to FIGS. 14A-14C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 15A:
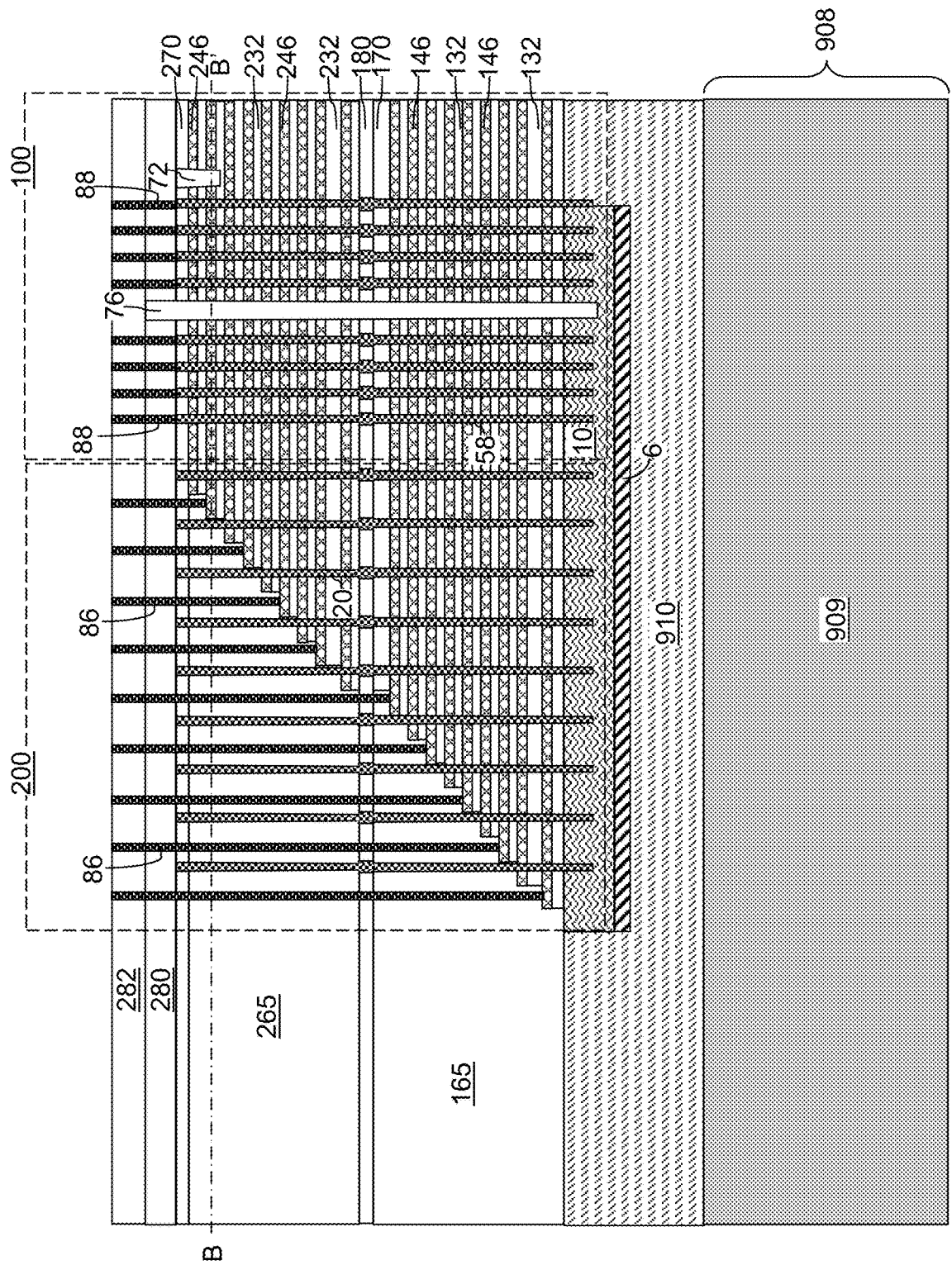
FIG. 15A is a schematic vertical cross-sectional view of the exemplary structure after formation of a second contact-level dielectric layer and various contact via structures according to an embodiment of the present disclosure.
Figure 15B:
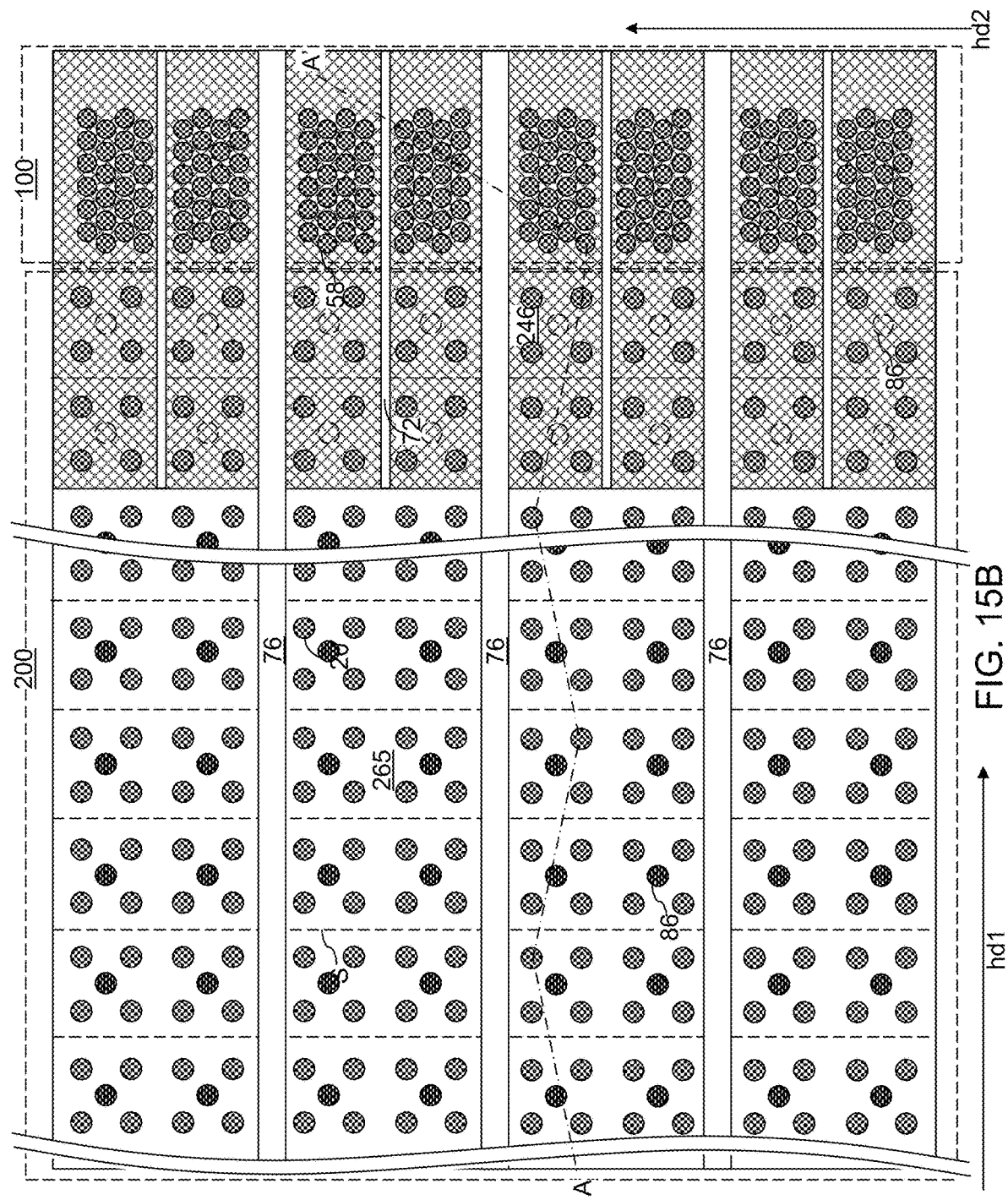
FIG. 15B is a horizontal cross-sectional view of the exemplary structure along the vertical plane B-B' of FIG. 15A. The hinged vertical plane A-A' corresponds to the plane of the schematic vertical cross-sectional view of FIG. 15A.

Referring to FIGS. 15A and 15B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process may be performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 may be formed in the drain contact via cavities and on a top surface of a respective one of the drain regions 63. Staircase-region contact via structures 86 may be formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 16:
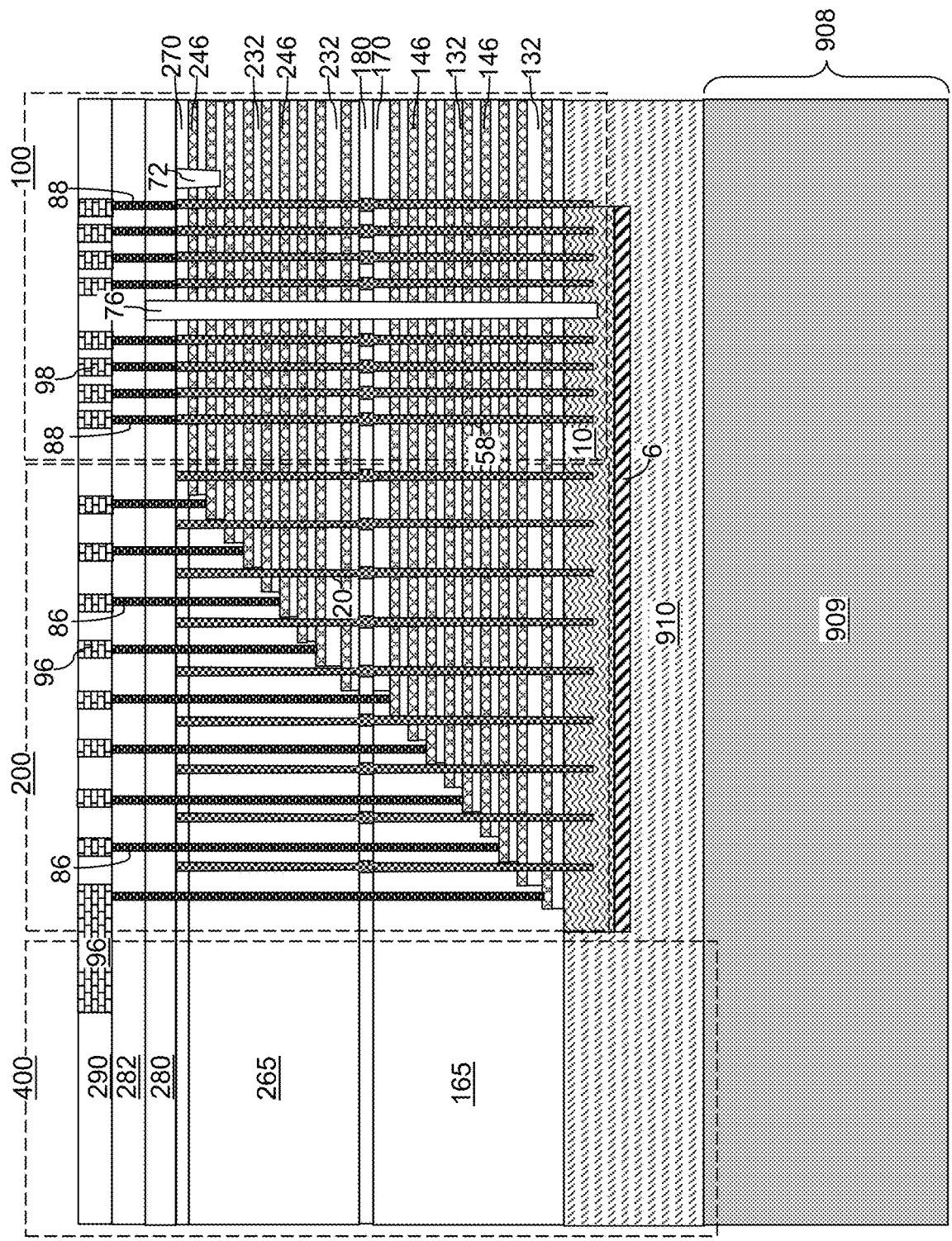
FIG. 16 is a schematic vertical cross-sectional view of the exemplary structure after formation of metal line structures according to an embodiment of the present disclosure.

Referring to FIG. 16, through-memory-level via cavities may be formed through the second and first contact-level dielectric layers (282, 280), the second and first stepped dielectric material portions (265, 165), and the source-side dielectric material layer 910 to top surfaces of the semiconductor substrate layer 909 in the via interconnection region 400. At least one conductive material may be deposited in the through-memory-level via cavities. Excess portions of the at least one conductive material may be removed from above the horizontal plane including the top surface of the second contact-level dielectric layer 282. Each remaining portion of the at least one conductive material in a through-memory-level via cavity constitutes a through-memory-level via structure (e.g., bit line) 98.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that may be formed over the contact-level dielectric layers (280, 282). The upper-level metal interconnect structures may include through-memory-level via structures 98 contacting a respective one of the drain contact via structures 88, and interconnection line structures 96 contacting, and/or electrically connected to, at least one of the staircase-region contact via structures 86 and/or the through-memory-level via structures (e.g., bit lines) 98.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the first substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the first substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the first substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 17A:
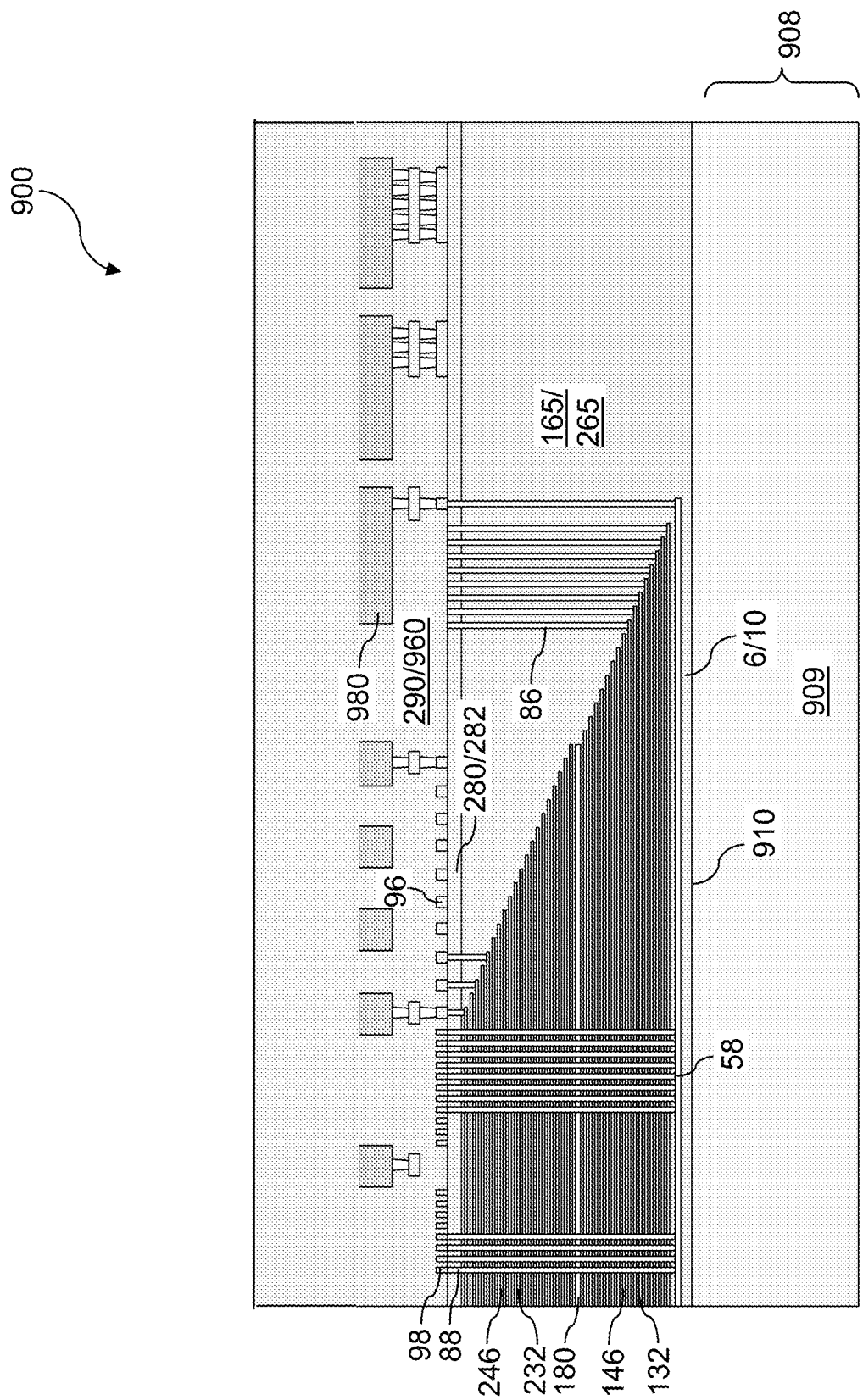
FIG. 17A is a schematic vertical cross-sectional view of the exemplary structure that includes a first semiconductor die after formation of additional interconnect-level dielectric material layers and first bonding pads according to an embodiment of the present disclosure.
Figure 17B:
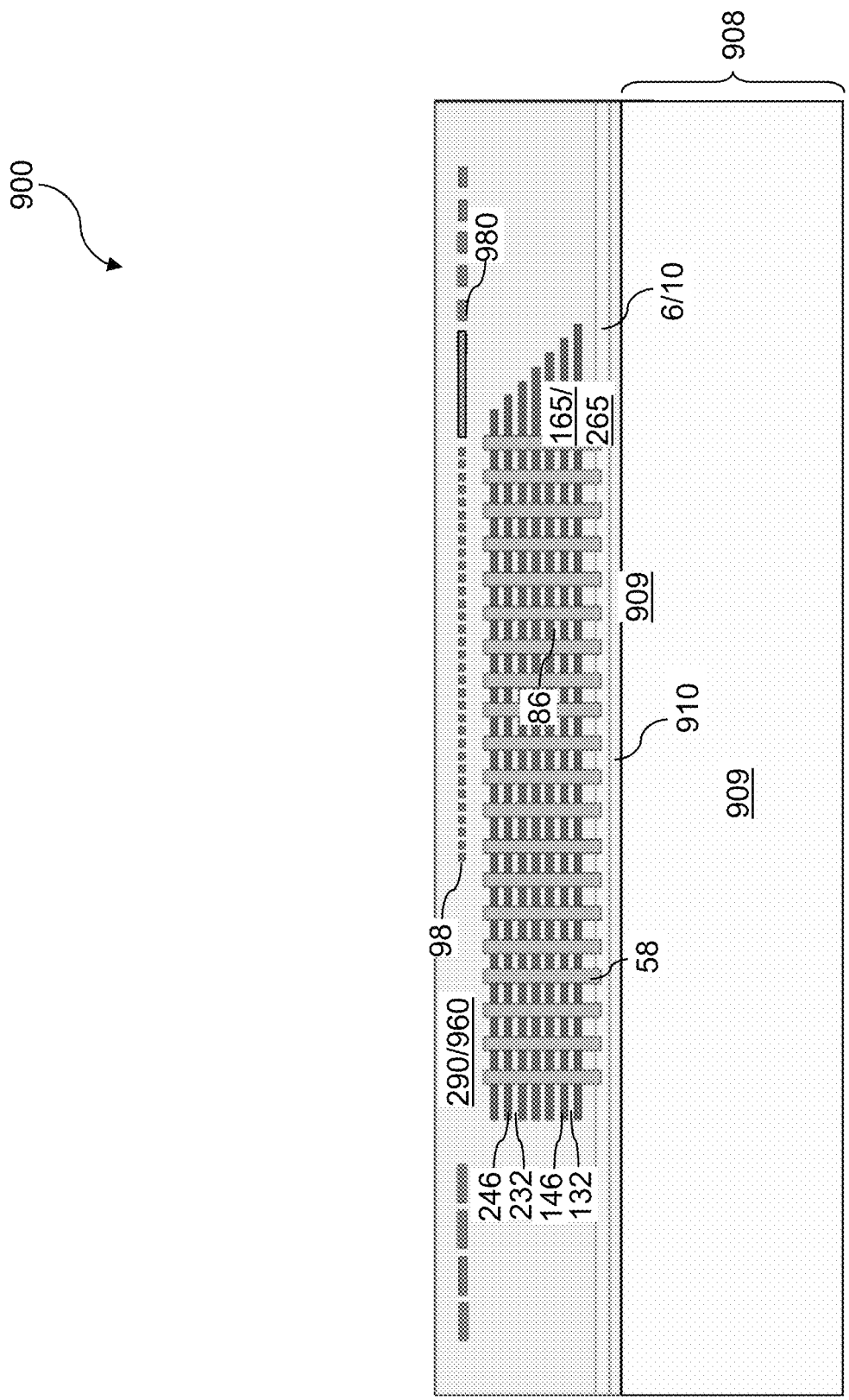
FIG. 17B is another schematic vertical cross-sectional view of the exemplary structure at the processing steps of FIG. 17A.

Referring to FIGS. 17A and 17B, a first semiconductor die 900 may be provided by forming additional dielectric material layers, which are herein referred to as first dielectric material layers 960. Additional metal interconnect structures may be formed within the first dielectric material layers 960. The additional metal interconnect structures are herein referred to as first metal interconnect structures 980. In one embodiment, the topmost surface of the first dielectric material layers 960 may include a silicon oxide surface such as a surface of undoped silicate glass or a surface of a doped silicate glass. In one embodiment, the topmost surface of the first dielectric material layers 960 may be free of a metallic surface such as a metallic surface of a metal bonding pad. In one embodiment, the entirety of the topmost surface of the first dielectric material layers 960 may consist of the silicon oxide surface.

Generally, the first semiconductor die 900 includes a first substrate 908 including a semiconductor substrate layer 909, first semiconductor devices (which may include a three-dimensional array of memory elements) overlying the first substrate 908, first dielectric material layers 960 overlying the first semiconductor devices and having a first silicon oxide surface as a topmost surface, and first metal interconnect structures 980 formed within the first dielectric material layers 960. In one embodiment, the first semiconductor die 900 may comprise a memory die including a three-dimensional array of memory elements. In another embodiment, the first semiconductor die 900 may comprises a support die including a peripheral circuitry configured to control operation of a three-dimensional array of memory elements in a memory die to be subsequently bonded to the first semiconductor die 900. In one embodiment, a plurality of first semiconductor dies 900 may be provided on a first semiconductor wafer. Each first semiconductor die 900 may have a physically exposed silicon oxide surface, which is herein referred to as a first silicon oxide surface.

Figure 18A:
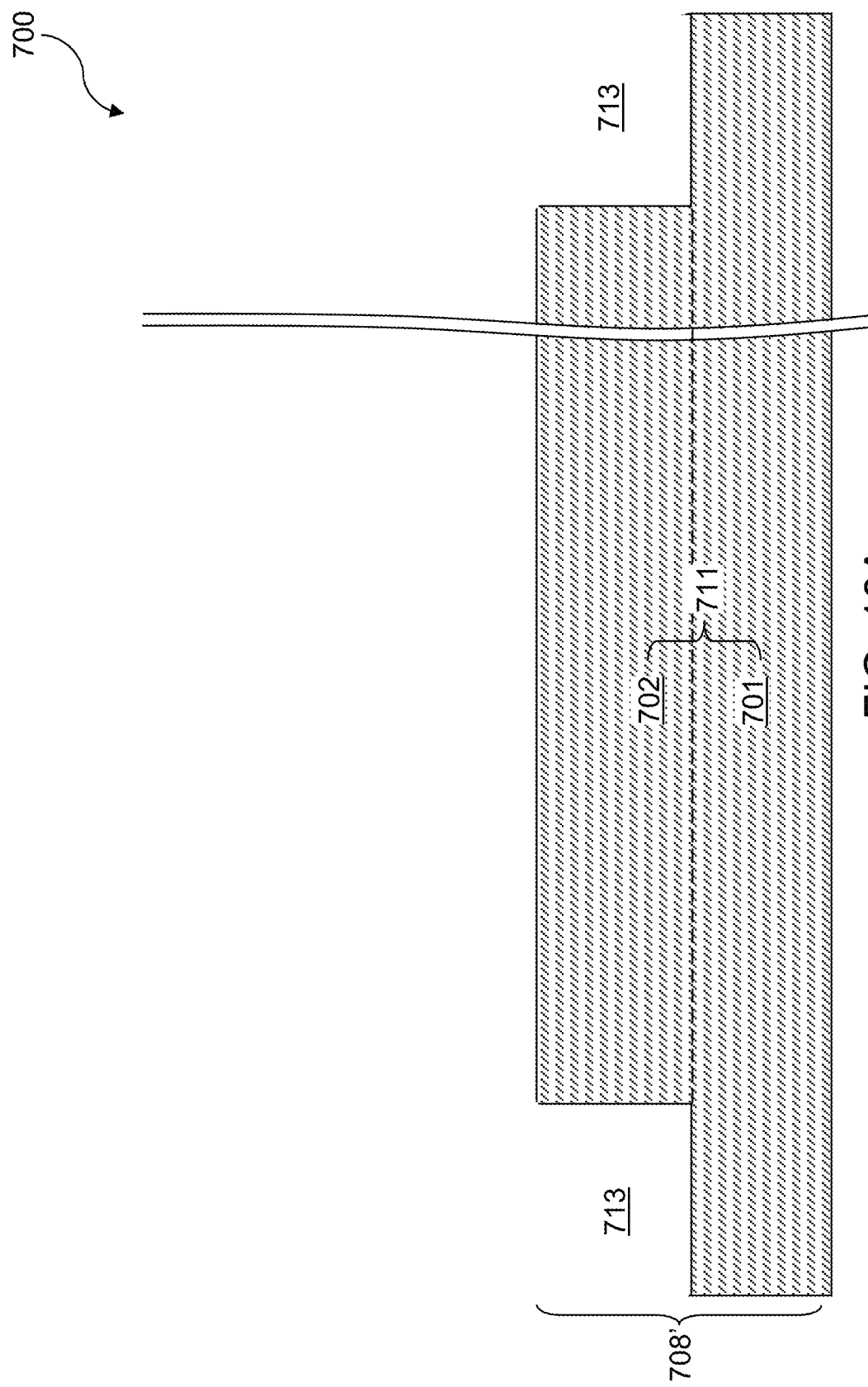
FIG. 18A is a schematic vertical cross-sectional view of an in-process second semiconductor die after formation of a moat trench according to an embodiment of the present disclosure.
Figure 18B:
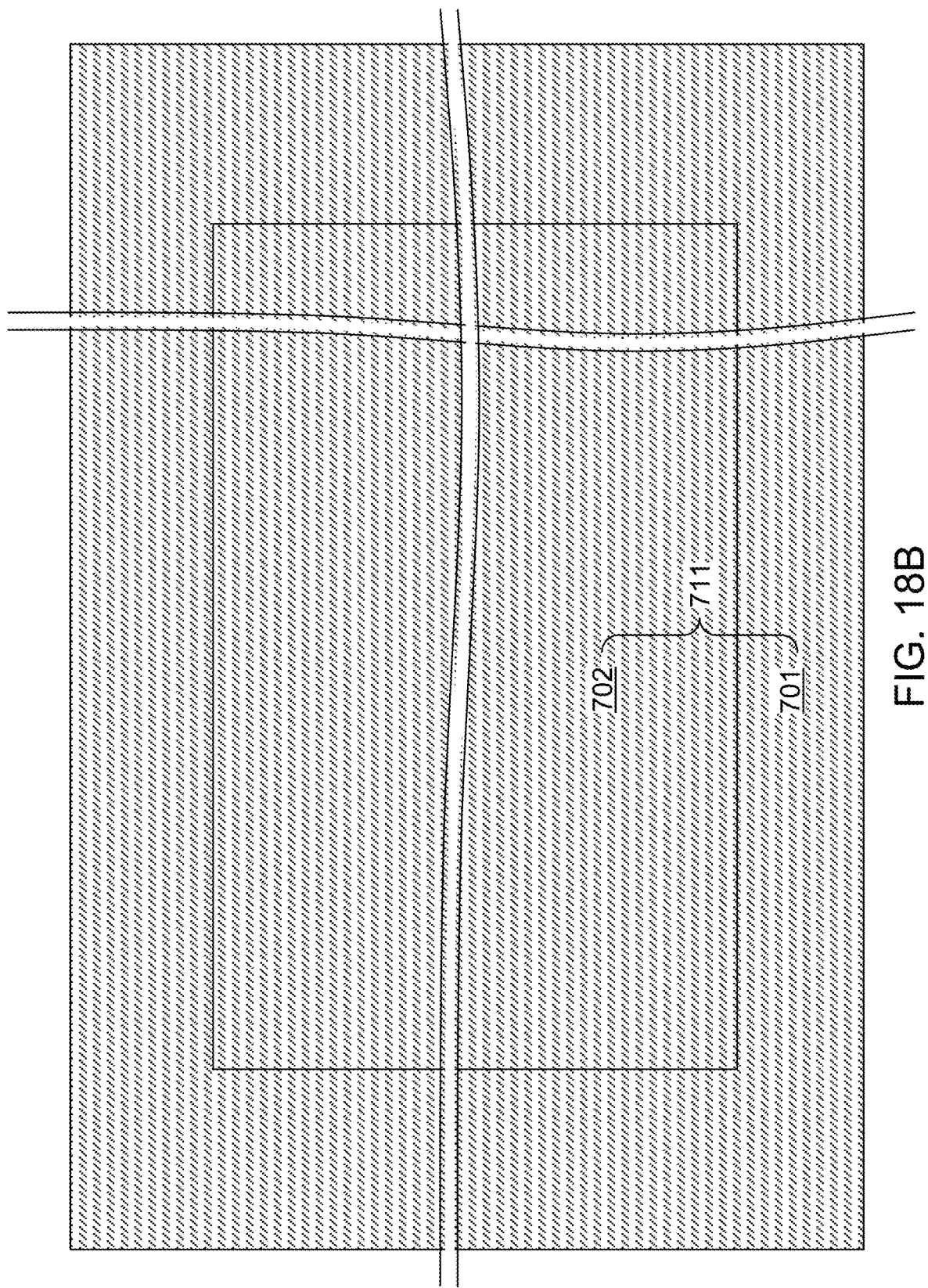
FIG. 18B is a top-down view of the in-process second semiconductor die of FIG. 18A.

Referring to FIGS. 18A and 18B, an in-process second semiconductor die 700 including a second substrate 708' is illustrated. The second substrate 708' includes a semiconductor material layer 711. The semiconductor material layer 711 may include a single crystalline semiconductor material. In one embodiment, the semiconductor material layer 711 may be a portion of a commercially available single crystalline silicon substrate.

A photoresist layer (not shown) may be applied over a top surface of the semiconductor material layer 711, and may be lithographically patterned to form at least one moat-shaped opening that surrounds a respective area covered by a remaining portion of the photoresist layer. An anisotropic etch process may be performed transfer the pattern in the photoresist layer through a front-side portion of the semiconductor material layer 711. A moat trench 713 that laterally surrounds an unrecessed portion of the semiconductor material layer 711 may be formed underneath each moat-shaped opening in the photoresist layer. The photoresist layer may be subsequently removed, for example, by ashing. The depth of each moat trench 713 may be in a range from 0.5 micron to 60 microns, such as from 1 micron to 30 microns, although lesser and greater depths may also be used. Each remaining portion of the semiconductor material layer 711 that overlies a horizontal plane including the bottom surface of each moat trench 713 is herein referred to as a semiconductor plate 702. The contiguous remaining portion of the semiconductor material layer 711 that underlies the horizontal plane including the bottom surface of each moat trench 713 constitutes a baskside semiconductor layer portion 701. The thickness of the backside semiconductor layer portion 701 may be in a range from 5 times the thickness of each semiconductor plate 702 to 2,000 times the thickness of each semiconductor plate 702. For example, the thickness of the backside semiconductor layer portion 701 may be in a range from 360 microns to 1,000 microns, although lesser and greater thicknesses may also be used. Each moat trench 713 may laterally surround an unrecessed portion of the semiconductor material layer 711, i.e., a semiconductor plate 702.

Figure 18C:
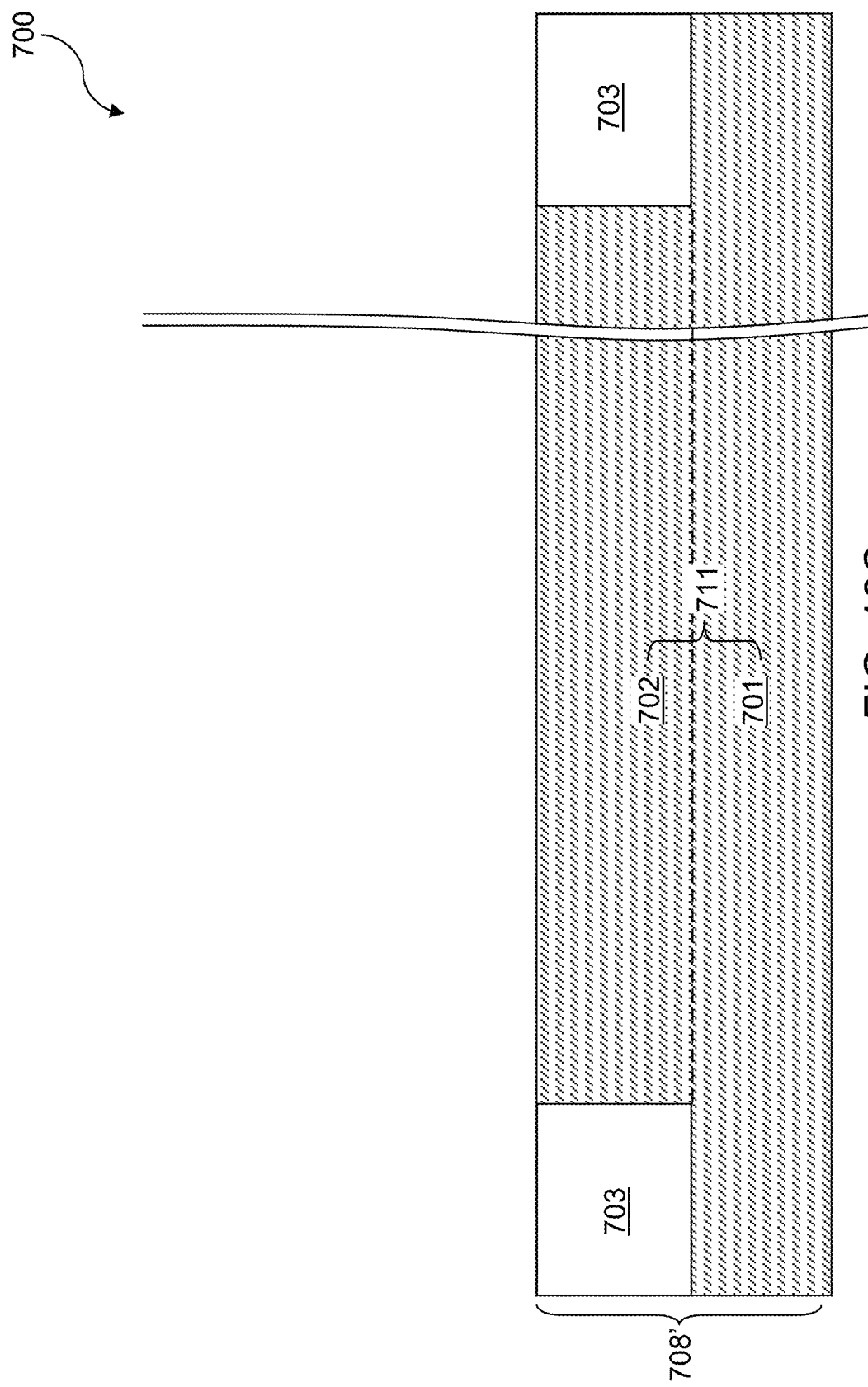
FIG. 18C is a schematic vertical cross-sectional view of the in-process second semiconductor die after formation of a substrate dielectric matrix according to an embodiment of the present disclosure.

Referring to FIG. 18C, a dielectric material may be deposited in each moat trench 713. The dielectric material may include a dielectric material such as undoped silicate glass, a doped silicate glass, and organosilicate glass. The dielectric material may be deposited by a conformal deposition process such as chemical vapor deposition and/or by a self-planarizing deposition process such as spin-coating. Excess portions of the dielectric material may be removed from above the horizontal plane including the top surface of the semiconductor material layer 711 by a planarization process, which may use a recess etch process and/or a chemical mechanical planarization (CMP) process. Each remaining annular portion of the dielectric material that fill a respective moat trench 713 may constitute a substrate dielectric matrix 703. In one embodiment, a single substrate dielectric matrix 703 may be formed per semiconductor die to be fabricated over remaining portions of the semiconductor material layer 711. In another embodiment, a plurality of substrate dielectric matrices 703 may be formed per semiconductor die to be fabricated over remaining portions of the semiconductor material layer 711.

Figure 18D:
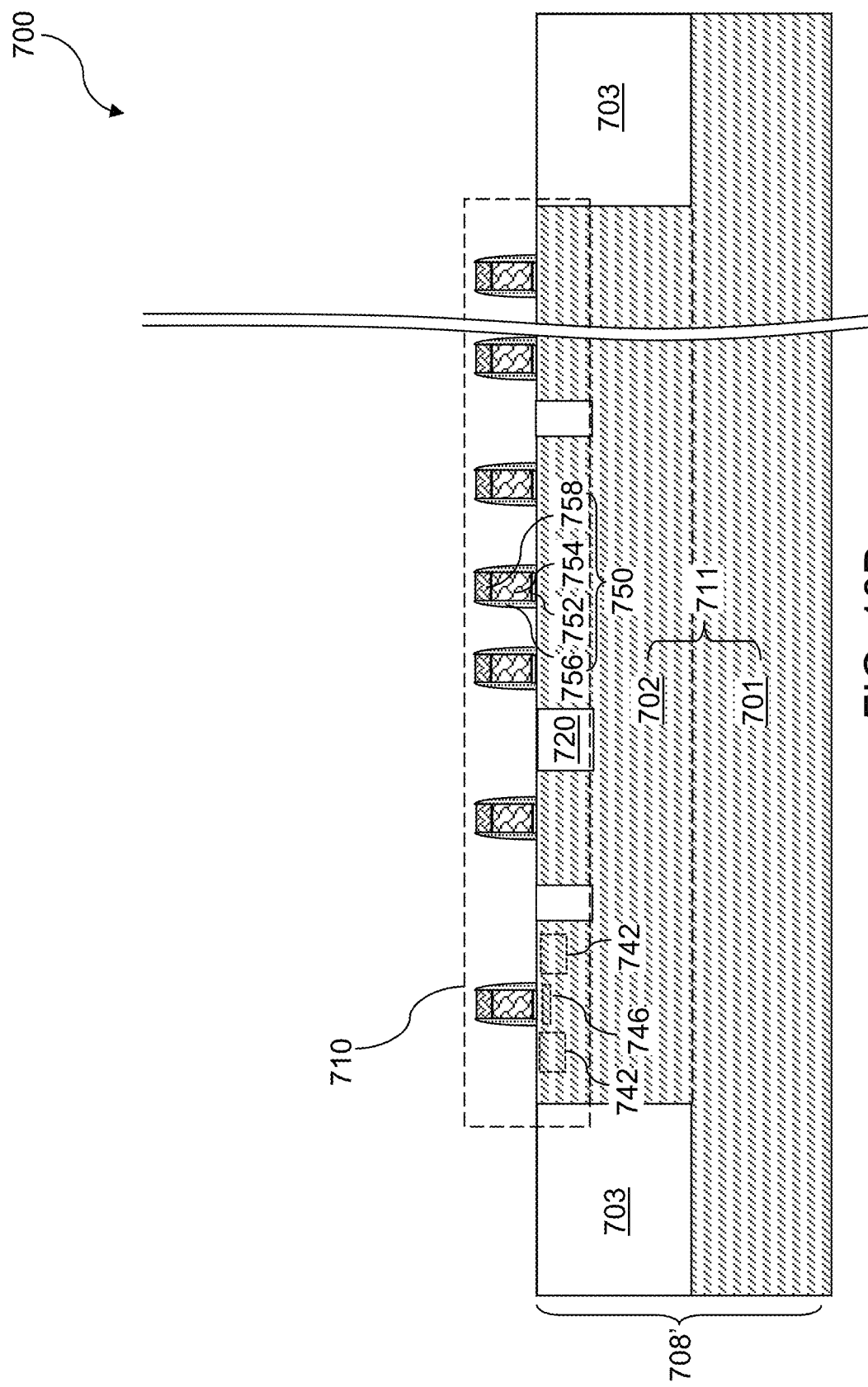
FIG. 18D is a schematic vertical cross-sectional view of the in-process second semiconductor die after formation of second semiconductor devices according to an embodiment of the present disclosure.

Referring to FIG. 18D, second semiconductor devices 710 may be formed on a top surface of each semiconductor plate 702. In one embodiment, the second semiconductor devices 710 may include a peripheral circuitry for operation of the three-dimensional memory arrays in a memory die (such as the first semiconductor die 900). The peripheral circuitry may include a word line driver that may drive word lines of the three-dimensional memory array (comprising the electrically conductive layers (146, 246)) within the first semiconductor die 900, a bit line driver that may drive the bit lines 98 in the first semiconductor die 900, a word line decoder circuit that may decode the addresses for the electrically conductive layers (146, 246), a bit line decoder circuit that may decode the addresses for the bit lines 98, a sense amplifier circuit that may sense the states of memory elements within the memory stack structures 55 in the first semiconductor die 900, a source power supply circuit that may provide power to the source semiconductor layer 10 in the first semiconductor die 900, a data buffer and/or latch, or any other semiconductor circuit that may be used to operate the array of memory stack structures 55 in the first semiconductor die 900.

Shallow trench isolation structures 720 may be provided through the semiconductor plate 702 to provide electrical isolation from the various semiconductor devices 710. The second semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the second semiconductor devices 710 may include word line drivers for electrically biasing word lines of the first semiconductor die 900, which comprise the electrically conductive layers (146, 246), and source power supply field effect transistors that generate power to be supplied to the source semiconductor layer in the first semiconductor die 900

Figure 18E:
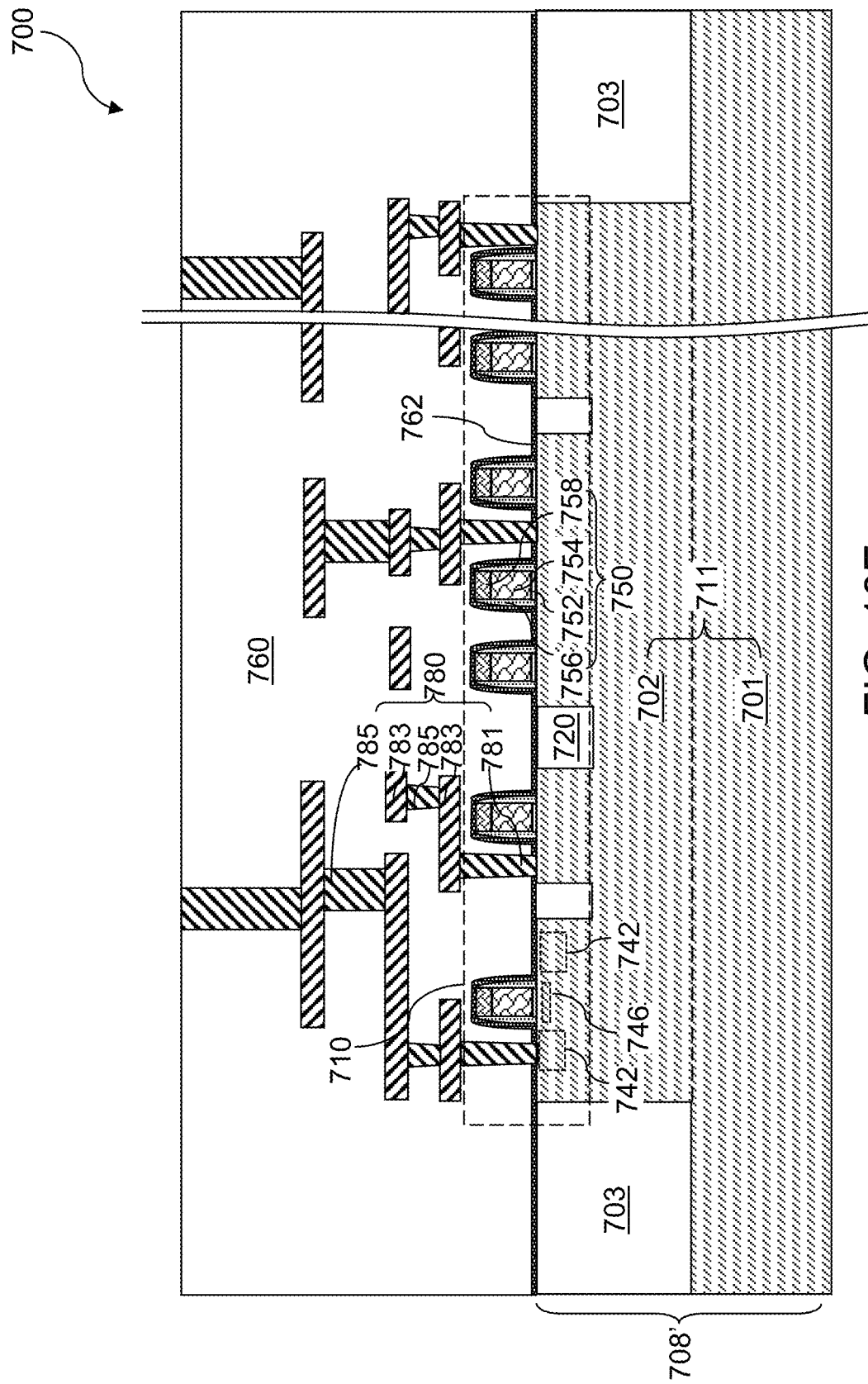
FIG. 18E is a schematic vertical cross-sectional view of the in-process second semiconductor die after formation of second metal interconnect structures and second dielectric material layers according to an embodiment of the present disclosure.

Referring to FIG. 18E, dielectric material layers may be formed over the semiconductor devices 710, which are herein referred to as second dielectric material layers 760. The second dielectric material layers 760 may include a dielectric liner 762 (such as a silicon nitride liner), which may apply mechanical stress to the various field effect transistors and/or may prevent diffusion of hydrogen or impurities from the second dielectric material layers 760 into the second semiconductor devices 710. Second metal interconnect structures 780 may be formed within the second dielectric material layers 760. The second metal interconnect structures 780 may include various device contact via structures 781 (e.g., source and drain electrodes which contact the respective source and drain nodes of the device or gate electrode contacts), interconnect-level metal line structures 783, and interconnect-level metal via structures 785. In one embodiment, a subset of the second metal interconnect structures 780 may have physically exposed surfaces at a horizontal plane including the topmost dielectric surface of the second dielectric material layers 760. In another embodiment, all of the second metal interconnect structures 780 may be formed within the second dielectric material layers 760 such that surfaces of the second metal interconnect structures 780 are not physically exposed at the horizontal plane including the topmost dielectric surface of the second dielectric material layers 760. A second semiconductor die 700 may be provided, which includes the second substrate 708', the second semiconductor devices 710, the second dielectric material layers 760, and the second metal interconnect structures 780 formed in the second dielectric material layers 760. The second substrate 708' may include the baskside semiconductor layer portion 701, semiconductor plates 702, and substrate dielectric matrix 703. A plurality of second semiconductor dies 700 may be provided within a semiconductor wafer. In this case, the total number of the semiconductor plates 702 may be at least the total number of the second semiconductor dies 700 within the semiconductor wafer.

Generally, a second semiconductor die 700 may be provided, which includes a second substrate 708', second semiconductor devices 710 overlying a front-side surface of the second substrate 708', second dielectric material layers 760 overlying the second semiconductor devices 710, and second metal interconnect structures 780 formed within the second dielectric material layers 760. In one embodiment, the second semiconductor die 700 may comprise a support die including a peripheral circuitry configured to control the three-dimensional array of memory elements as the second semiconductor devices 710. In one embodiment, the second semiconductor devices 710 comprise field effect transistors formed on a front surface of a semiconductor plate 702 and including respective transistor active regions 742 formed in an upper portion of the semiconductor plate 702. In one embodiment, the field effect transistors may be electrically isolated from one another by shallow trench isolation structures 720 formed in the upper portion of the semiconductor plate 702. The maximum thickness of the shallow trench isolation structures 720 may be less than a maximum thickness of the semiconductor plate 702. For example, the maximum thickness of the shallow trench isolation structures 720 may be in a range from 100 nm to 500 nm, and the maximum thickness of the semiconductor plate 702 may be in a range from 0.5 micron to 60 microns. In one embodiment, the semiconductor plate 702 may have a maximum thickness in a range from 0.5 micron to 60 microns, and the substrate dielectric matrix 703 may have a maximum thickness in a range from 0.5 micron to 60 microns. In one embodiment, the maximum thickness of the semiconductor plate 702 may be the same as the maximum thickness of the substrate dielectric matrix 703. In one embodiment, the semiconductor plate 702 and the substrate dielectric matrix 703 may have a uniform thickness throughout. In one embodiment, each semiconductor plate 702 may be entirely encircled by the substrate dielectric matrix 703, and all sidewalls of the semiconductor plate 702 may contact the substrate dielectric matrix 703.

Figure 19:
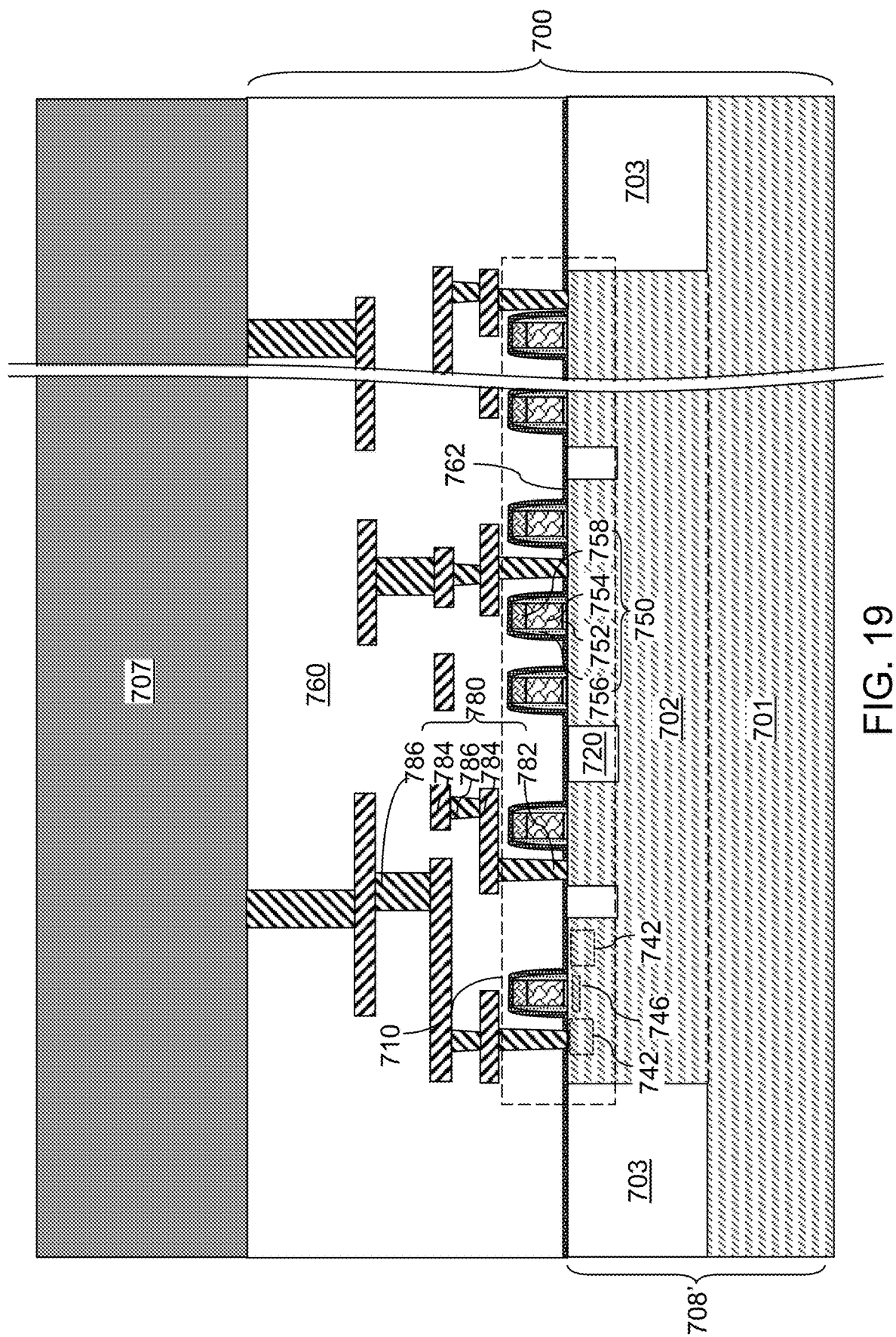
FIG. 19 is a schematic vertical cross-sectional view of the second semiconductor die after attaching a handle substrate to a front side thereof according to an embodiment of the present disclosure.

Referring to FIG. 19, a handle substrate 707 may be attached to the front side of the second semiconductor die 700, which is the topmost surface of the second semiconductor die 700. In one embodiment, a plurality of second semiconductor dies 700 may be provided on a second semiconductor wafer, and the handle substrate 707 may be laterally extend over, and may be attached to, the plurality of second semiconductor dies 700. The handle substrate 707 may include a structurally stable material having a sufficient thickness. For example, the handle substrate 707 may include an insulating material, a semiconducting material, or a conductive material, and may have a thickness in a range from 200 microns to 2 mm, although lesser and greater thicknesses may also be used. For example, the handle substrate 707 may include a glass substrate or a commercially available semiconductor wafer. The handle substrate 707 may be attached to the front side of each second semiconductor die 700 using a thermally deactivated adhesive material or an ultraviolet deactivated adhesive material.

Figure 20A:
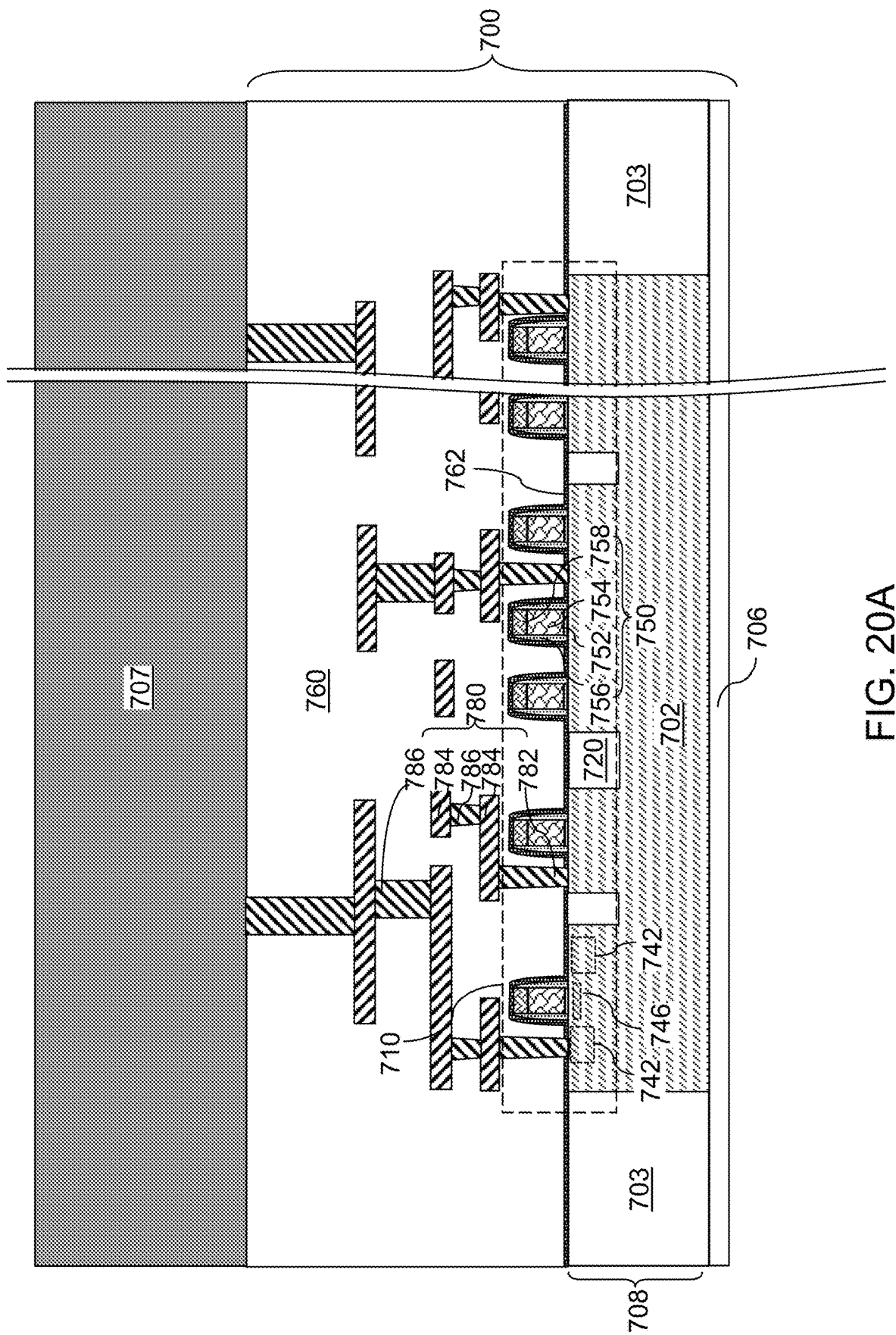
FIG. 20A is a schematic vertical cross-sectional view of an assembly of the handle substrate and the second semiconductor die after thinning a second substrate of the second semiconductor die and forming a backside silicon oxide layer on a backside surface of the thinned second substrate according to an embodiment of the present disclosure.
Figure 20B:
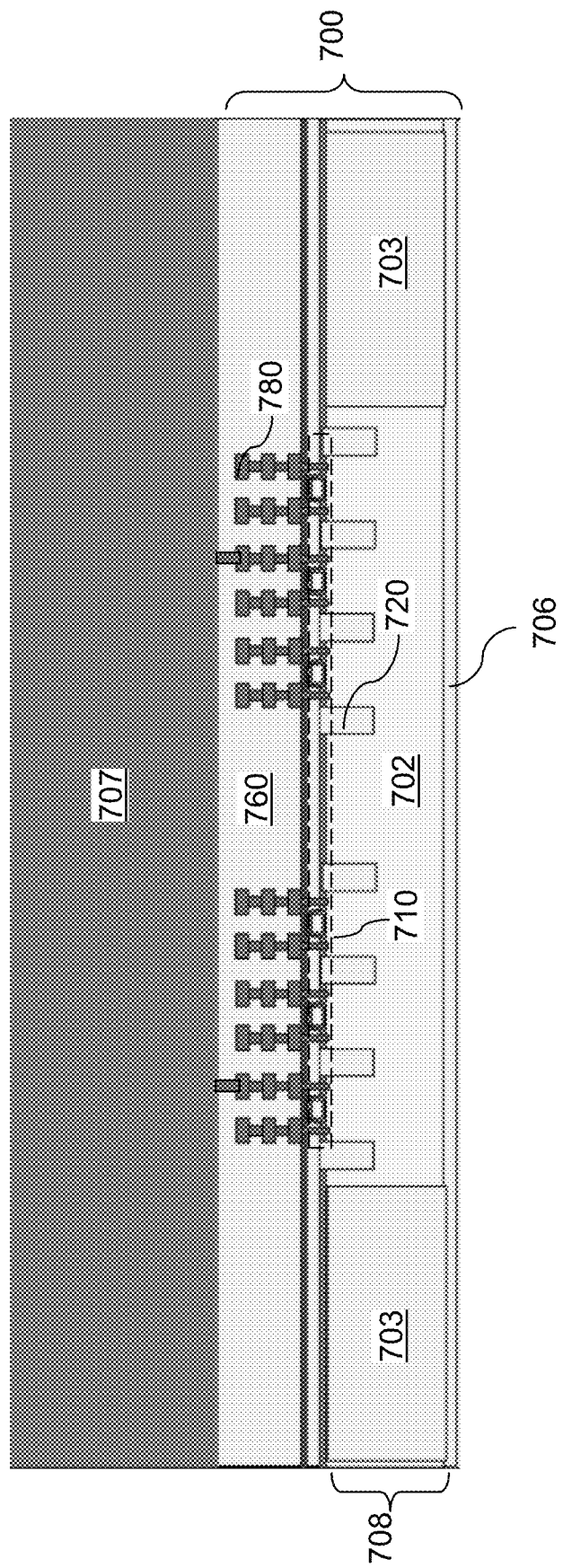
FIG. 20B is another schematic vertical cross-sectional view of the assembly of the handle substrate and the second semiconductor die of FIG. 20A.

Referring to FIGS. 20A and 20B, the second substrate 708' of the second semiconductor die 700 may be thinned to remove the baskside semiconductor layer portion 701. Removal of the material of the backside semiconductor layer portion 701 may be performed by grinding, polishing, an anisotropic etch process, and/or an isotropic etch process. A terminal step of the thinning process may use the substrate dielectric matrix 703 as a stopping structure. In one embodiment, the terminal step of the thinning process may provide a flat backside surface that includes a backside surface of each semiconductor plate 702 and a backside surface of the substrate dielectric matrix 703 within a same horizontal plane. The remaining portions of the second substrate 708' includes the substrate dielectric matrix 703 and each semiconductor plate 702 formed in the substrate dielectric matrix 703, and is herein referred to as a second substrate 708. Each semiconductor plate 702 may have a maximum thickness in a range from 0.5 micron to 60 microns, and the substrate dielectric matrix 703 may have a maximum thickness in a range from 0.5 micron to 60 microns. Each semiconductor plate 702 and the substrate dielectric matrix 703 may have a same uniform thickness throughout.

A backside silicon oxide layer 706 may be deposited on the backside surface of the second substrate 708, and may be incorporated into the second substrate 708. The backside silicon oxide layer 706 may be deposited by a conformal deposition process such as chemical vapor deposition, or by a self-planarizing deposition process such as spin coating. The thickness of the backside silicon oxide layer 706 may be in a range from 100 nm to 5,000 nm, although lesser and greater thicknesses may also be used. The bottom surface of the backside silicon oxide layer 706 includes a physically exposed silicon oxide surface, which is herein referred to as a second silicon oxide surface. Generally, a second silicon oxide surface may be provided on a backside surface of the thinned second substrate 708. For example, the second silicon oxide surface may comprise a backside surface of the backside silicon oxide layer 706. The backside silicon oxide layer 706 may contact a backside surface of each semiconductor plate 702 and a backside surface of the substrate dielectric matrix 703.

Figure 21:
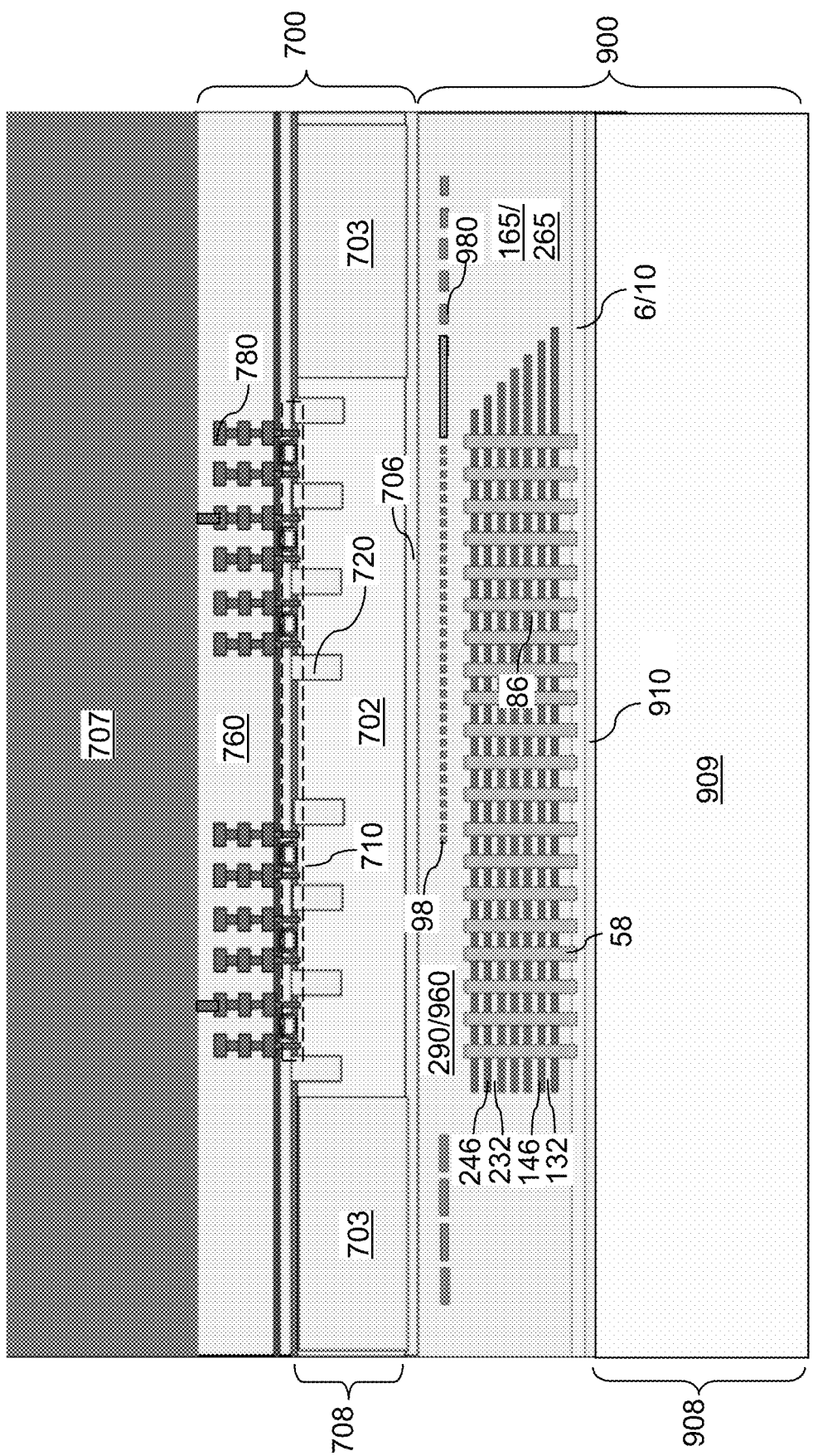
FIG. 21 is a schematic vertical cross-sectional view of the exemplary structure after bonding the second semiconductor die to the first semiconductor die according to an embodiment of the present disclosure.

Referring to FIG. 21, the assembly including the handle substrate 707 and the second semiconductor die 700 (which may include a plurality of second semiconductor dies 700 attached to a same handle substrate 707) may be positioned such that the second silicon oxide surface of the backside silicon oxide layer 706 faces the first silicon oxide surface of the first dielectric material layers 960 of the first semiconductor die 900 (which may be attached to a first wafer including a plurality of first semiconductor dies 900). The second semiconductor die 700 may be bonded to the first semiconductor die 900 by inducing oxide-to-oxide bonding between the second silicon oxide surface and the first silicon oxide surface. In one embodiment, the entirety of the physically exposed surface of the first semiconductor die 900 that faces the second semiconductor die 700 may consist of the first silicon oxide surface, and the entirety of the physically exposed surface of the second semiconductor die 700 that faces the first semiconductor die 900 may have a silicon oxide surface, i.e., the second silicon oxide surface. The strength of bonding between the first semiconductor die 900 and the second semiconductor die 700 may be enhanced by providing silicon oxide surfaces across the entirety of the interface between the first semiconductor die 900 and the second semiconductor die 700. In case a wafer-to-wafer bonding is used, a plurality of second semiconductor dies 700 may be bonded to a plurality of first semiconductor dies 900 simultaneously.

In one embodiment, electrically conductive layers (e.g., word lines) (146, 246) and memory opening fill structures 58 may be located in the first semiconductor die 900 below the substrate dielectric matrix 703 of the second semiconductor die 700. In another embodiment, peripheral devices (e.g., support devices), such as transistors and pool capacitors may be located in the first semiconductor die 900 below the substrate dielectric matrix 703 of the second semiconductor die 700.

Figure 22:
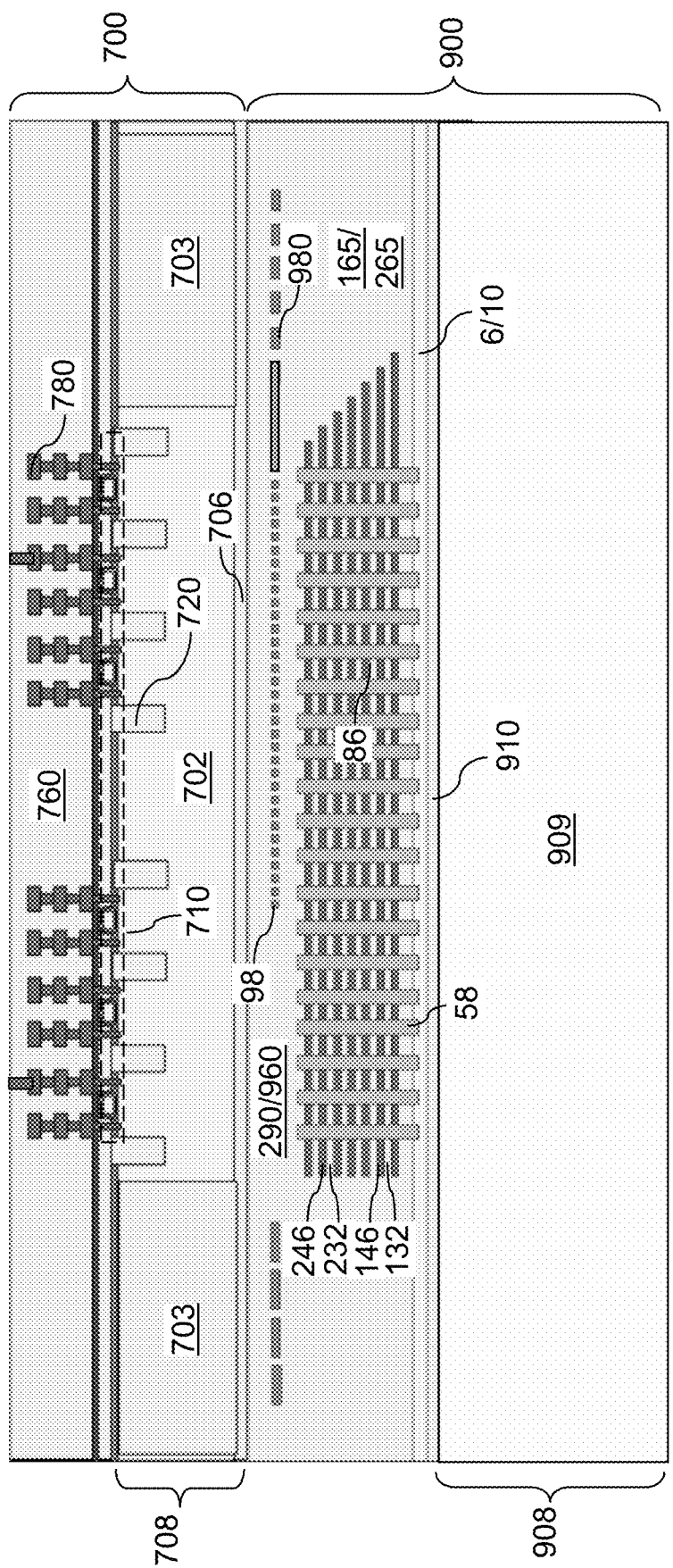
FIG. 22 is a schematic vertical cross-sectional view of the exemplary structure after removal of the handle substrate according to an embodiment of the present disclosure.

Referring to FIG. 22, the handle substrate 707 may be detached from the second dielectric material layers 760 by deactivating the adhesive material between the second dielectric material layers 760 and the handle substrate 707. The handle substrate 707 may be subsequently reused for transfer of another substrate for another bonding process. The physically exposed top surface of the second dielectric material layers 760 may be cleaned with a suitable cleaning process such as a wet clean process.

Figure 23:
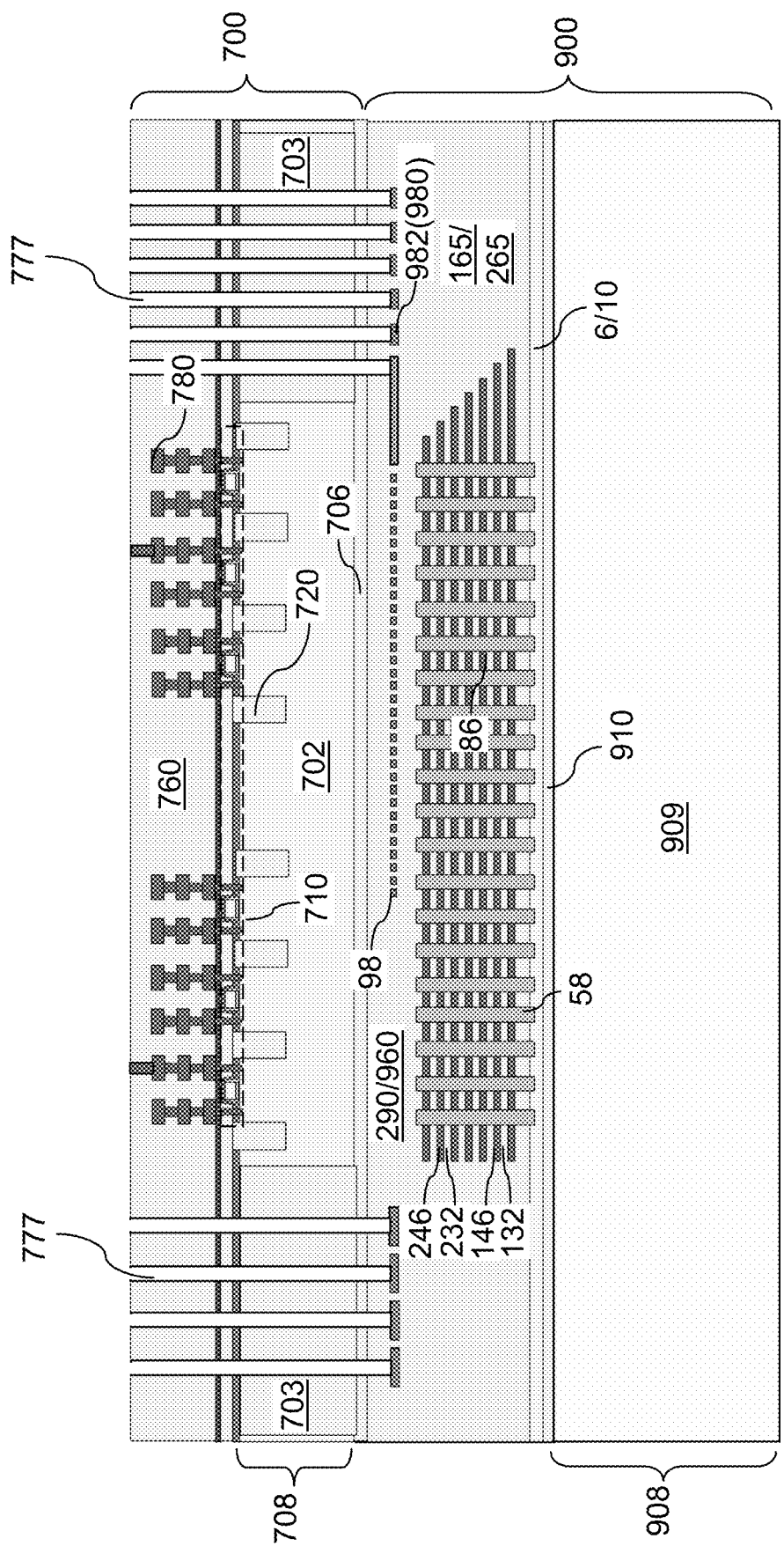
FIG. 23 is a schematic vertical cross-sectional view of the exemplary structure after formation of inter-die via cavities according to an embodiment of the present disclosure.

Referring to FIG. 23, a photoresist layer (not shown) may be applied over the physically exposed top surface of the second dielectric material layers 760, and may be lithographically patterned to form openings in areas in which inter-die via cavities 777 are to be subsequently formed. An anisotropic etch process is performed to transfer the pattern of openings in the photoresist layer through the entire thickness of the second semiconductor die 700, through the interface between the first semiconductor die 700 and the first semiconductor die 900, through an upper portion of the first dielectric material layers 960, and to a top surface of a respective one of the first metal interconnect structures 980 that underlie the openings in the photoresist layer. Each cavity formed by the anisotropic etch process constitutes an inter-die via cavity 777. The photoresist layer may be subsequently removed, for example, by ashing. Each inter-die via cavity 777 vertically extends from the topmost surface of the second dielectric material layers 760 to a top surface of a respective one of the first metal interconnect structures 980. Each first metal interconnect structure 980 upon which one of the inter-die via cavity 777 lands is herein referred to as a first metal pad structure 982.

In one embodiment, each inter-die via cavity 777 vertically extends through the substrate dielectric matrix 703 but does not extend through the semiconductor plate (e.g., silicon plate) 702. Thus, through silicon via cavities may be omitted. In an alternative embodiment, one or more inter-die via cavities 777 may vertically extend through the semiconductor plate (e.g., silicon plate) 702 to form through silicon via cavities.

Figure 24:
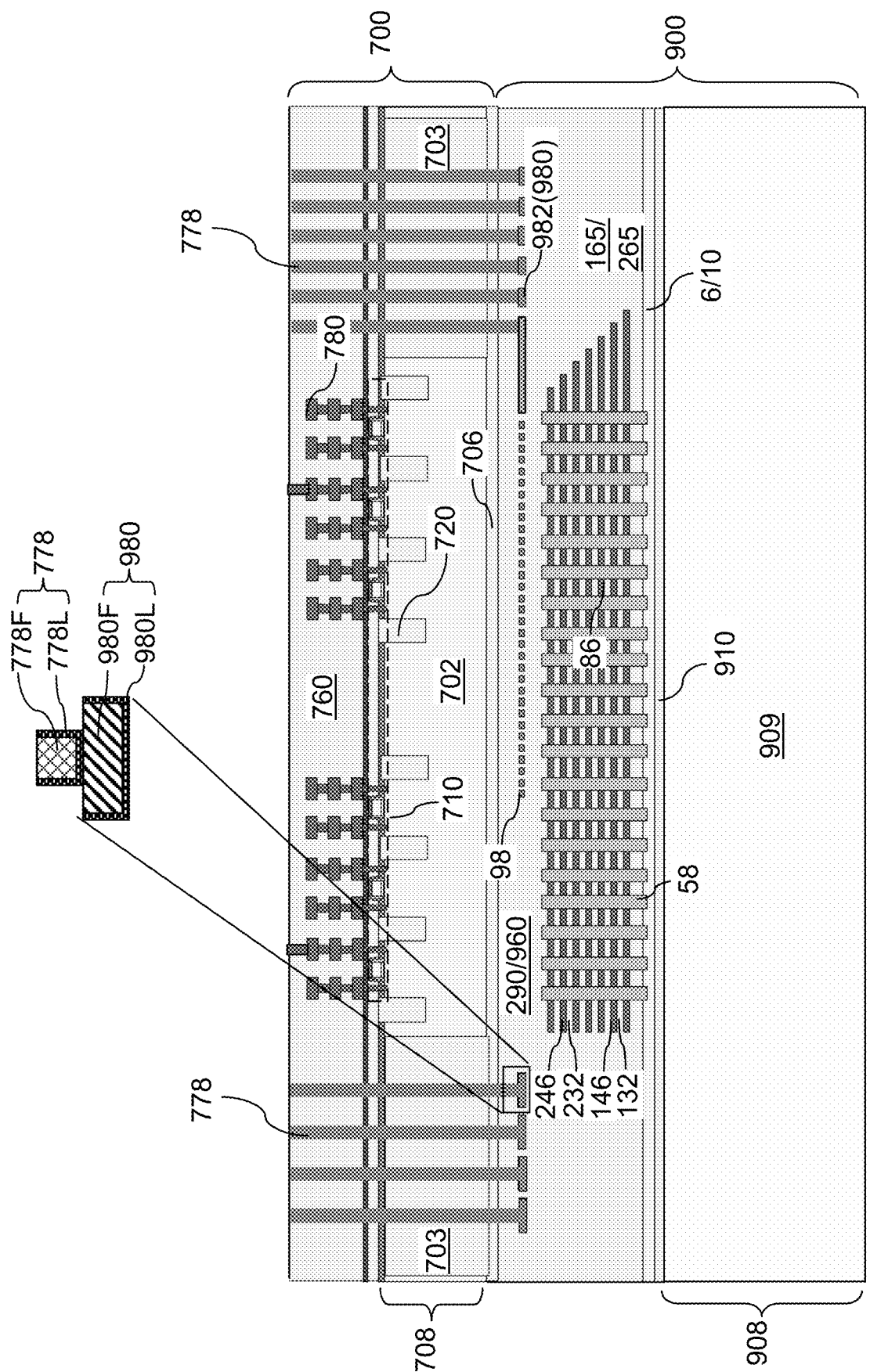
FIG. 24 is a schematic vertical cross-sectional view of the exemplary structure after formation of inter-die connection via structures according to an embodiment of the present disclosure.

Referring to FIG. 24, at least one metallic material may be deposited in each of the inter-die via cavities 777 by at least one conformal deposition process. Excess portions of the at least one metallic material may be removed from above the horizontal plane including the topmost surface of the second dielectric material layers 760 by a planarization process, which may include a recess etch process and/or a chemical mechanical planarization process. Each contiguous remaining portion of the at least one metallic material that fills a respective inter-die via cavity 777 constitutes an inter-die connection via structure 778. In one embodiment, each first metal pad structure 982 (which is a subset of the first metal interconnect structures 980 on which an inter-die connection via structure 778 is formed) may include a first metallic pad liner 980L containing a first metallic liner material (such as TiN, TaN, or WN) and a first metallic pad fill material portion 980F containing a first metallic fill material (such as W, Cu, Ru, Mo, or Al). In one embodiment, each inter-die connection via structure 778 may include a metallic via liner 778L containing a via metallic liner material (such as TiN, TaN, or WN) and a metallic via fill material portion 778F containing a via metal fill material (such as W, Cu, Ru, Mo, or Al). Each inter-die connection via structure 778 vertically extends through the second dielectric material layers 790 and the second substrate 708 and contacts a top surface of a respective first metal pad structure 982 selected from the first metal interconnect structures 980.

In one embodiment, each inter-die connection via structure 778 vertically extends through the substrate dielectric matrix 703 but does not extend through the semiconductor plate (e.g., silicon plate) 702. Thus, through silicon vias may be omitted. In an alternative embodiment, one or more inter-die connection via structures 778 may vertically extend through the semiconductor plate (e.g., silicon plate) 702 to form through silicon vias (TSV).

In one embodiment, the inter-die connection via structures 778 on the staircase region 200 side of the memory array region 100 may be used for electrical connection (i.e., hook up) to the electrically conductive layers (e.g., word lines) (146, 246), while the inter-die connection via structures 778 on the opposite side of the memory array region 100 may be used for electrical connection (i.e., hook up) to the bit lines 98.

Figure 25:
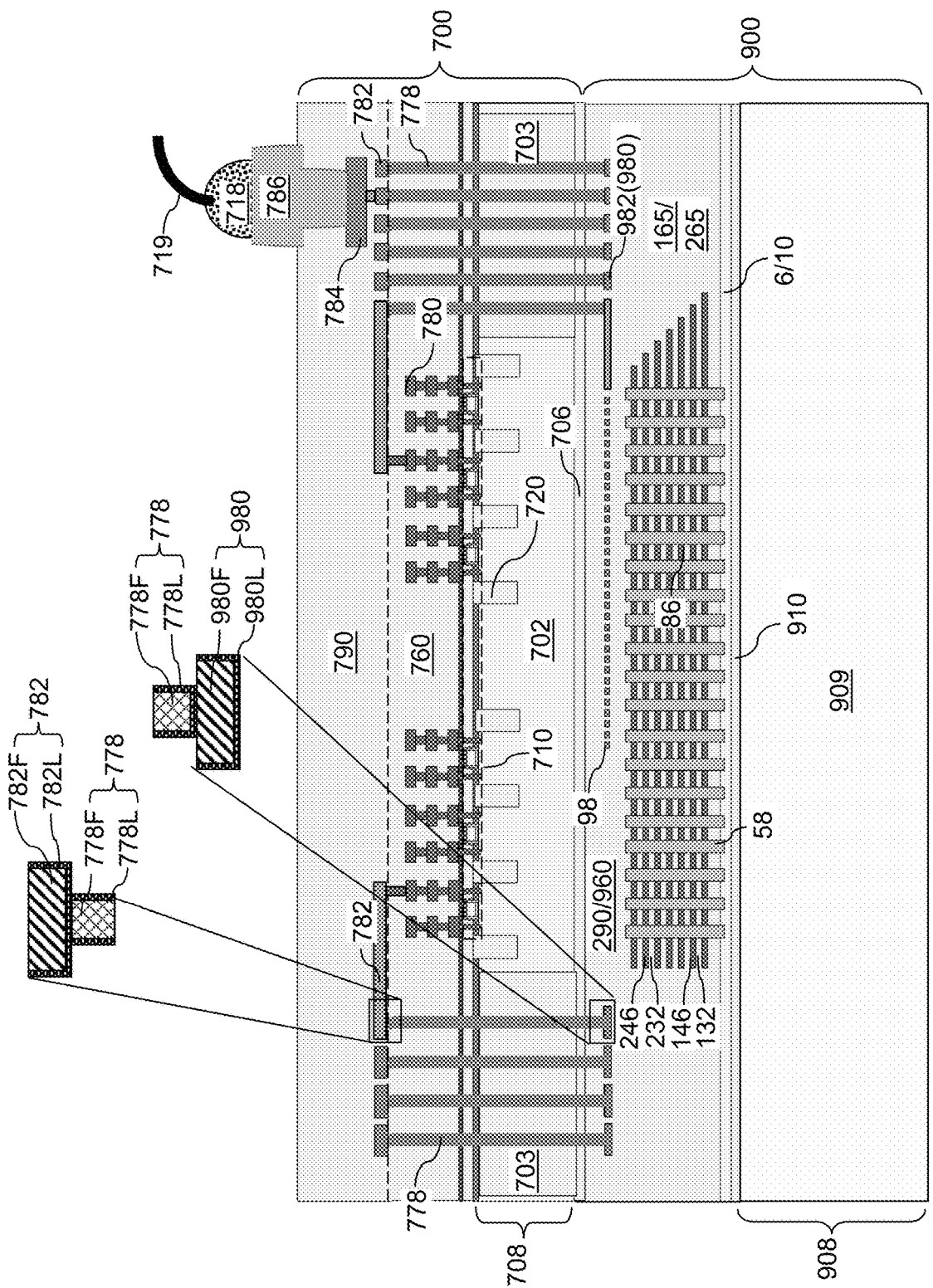
FIG. 25 is a schematic vertical cross-sectional view of the exemplary structure after formation of additional metal interconnect structures, additional dielectric material layers, external bonding pads, solder material portions, and bonding wires according to an embodiment of the present disclosure.

Referring to FIG. 25, additional second metal interconnect structures (782, 784) and additional second dielectric material layers 790 may be formed over the second dielectric material layers 760. The additional second metal interconnect structures (782, 784) may include second metal pad structures 782 that are formed on a top surface of a respective one of the inter-die connection via structures 778. In one embodiment, each second metal pad structure 782 may include a second metallic pad liner 782L containing a second metallic liner material (such as TiN, TaN, or WN) and a second metallic pad fill material portion 782F containing a second metallic fill material (such as W, Cu, Ru, Mo, or Al).

In one embodiment, each of the inter-die connection via structures 778 comprises a metallic via liner 778L and a metallic via fill material portion 778F, and a top surface of the metallic via fill material portion 778F contacts a second metallic pad liner 782L of one of the second metal pad structures 782, and may be vertically spaced from an underlying one of the first metal pad structures 982 (which is one of the first metal interconnect structures 980) by a horizontal portion of the metallic via liner 778L. In one embodiment, the underlying one of the first metal pad structures 982 (which is one of the first metal interconnect structures 980) comprises a first metallic pad liner 980L and a first metallic pad fill material portion 980F. The first metallic pad fill material portion 980F may contact a bottom surface of a horizontal portion of the metallic via liner 778L. In one embodiment, sidewall of the inter-die connection via structures 778 may vertically extend straight from the top surface of a respective first metal pad structure 982 selected from the first metal interconnect structures 980 to the bottom surface of the respective second metal pad structure 782.

External bonding pads 786 may be formed over the second metal pad structures 782. The additional second metal interconnect structures (782, 784) may optionally include pad contact metal interconnect structures 784 that are interposed between the second metal pad structures 782 and the external bonding pads 786. A subset of the external bonding pads 786 may be electrically connected to a respective one of the first metal pad structures through a respective one of the second metal pad structures 782. Another subset of the external bonding pads 786 may be electrically connected to a node within the second semiconductor die 700 through a respective one of the second metal pad structures 782 that are not electrically connected to the first metal pad structures.

A solder material portion 718 may be bonded to each external bonding pad 786. A bonding wire 719 may be bonded to each solder material portion 718 to provide electrical connection to an external structure such as a packaging substrate or a circuit board.

Figure 26:
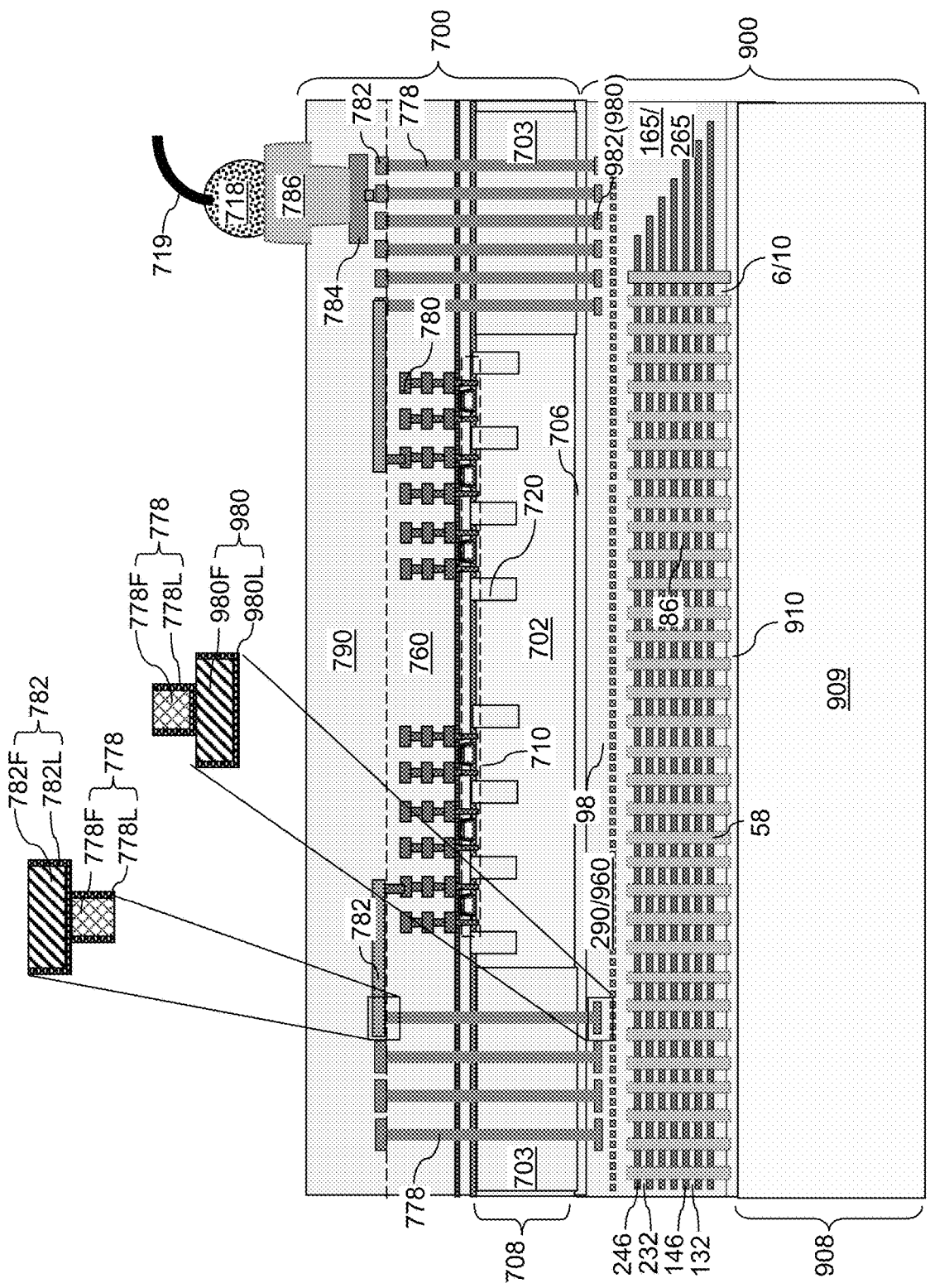
FIG. 26 is a schematic vertical cross-sectional view of an alternative configuration of the exemplary structure at the processing steps of FIG. 25.

Referring to FIG. 26, an alternative configuration of the exemplary structure is illustrated, which can be derived from the exemplary structure illustrated in FIG. 25 by forming a first subset of the first metal pad structures 980 within the memory array region 100 and/or by forming a second subset of the first metal pad structures 980 within the staircase region 300. Generally, the inter-die connection via structures 778 can be formed over any area of an underlying three-dimensional memory device provided that the inter-die connection via structures 778 pass through the substrate dielectric matrix 703. Generally, an insulating liner is not necessary around the inter-die connection via structures 778, and sidewalls of the inter-die connection via structures 778 can directly contact sidewalls of each dielectric material portion (including the substrate dielectric matrix 703) that the inter-die connection via structures 778 pass through. Elimination of the insulating spacers around the inter-die connection via structures 778 reduces production cost and processing time.

Referring to all drawings and according to various embodiments of the present disclosure, a bonded assembly is provided, which comprises: a first semiconductor die 900 comprising a first substrate 909, first semiconductor devices overlying the first substrate, first dielectric material layers 960 overlying the first semiconductor devices and having a first silicon oxide surface as an uppermost surface, and first metal interconnect structures 980 formed within the first dielectric material layers 960; a second semiconductor die 700 overlying the first semiconductor die 900, and comprising a second substrate 708, second semiconductor devices 710 overlying a front-side surface of the second substrate 708, second dielectric material layers 760 overlying the second semiconductor devices 710, and second metal interconnect structures (780, 782, 784) formed within the second dielectric material layers 760, wherein a second silicon oxide surface of the second semiconductor die 700 is located underneath the second substrate 708 and is bonded to the first silicon oxide surface of the first semiconductor die 900 at an oxide-to-oxide bonding interface; and inter-die connection via structures 778 vertically extending through the second substrate 708 and the oxide-to-oxide bonding interface, contacting a top surface of a respective first metal pad structure selected from the first metal interconnect structures 980, and contacting a bottom surface of a respective second metal pad structure 782.

In one embodiment, the bonded assembly comprises: an external bonding pad 786 overlying, and electrically connected to, one of the second metal pad structures 782; and a solder material portion 718 bonded to the external bonding pad 786.

In one embodiment, the second substrate 708 comprises: a semiconductor plate 702 consisting essentially of a semiconductor material; and a substrate dielectric matrix 703 laterally surrounding the semiconductor plate 702. In one embodiment, the inter-die connection via structures 778 (e.g., each and all structures 778) vertically extend through the substrate dielectric matrix 703 and do not extend through the semiconductor plate 702. In one embodiment, the semiconductor plate 702 has a maximum thickness in a range from 0.5 micron to 60 microns, and the substrate dielectric matrix 703 has a maximum thickness in a range from 0.5 micron to 60 microns. In one embodiment, the maximum thickness of the semiconductor plate 702 is the same as the maximum thickness of the substrate dielectric matrix 703.

In one embodiment, the second semiconductor devices 710 comprise field effect transistors located on a front surface of the semiconductor plate 702 and including respective transistor active regions 742 formed in an upper portion of the semiconductor plate 702; the field effect transistors are electrically isolated from one another by shallow trench isolation structures 720 formed in the upper portion of the semiconductor plate 702; and a maximum thickness of the shallow trench isolation structures 720 is less than the maximum thickness of the semiconductor plate 702. In one embodiment, the substrate dielectric matrix 703 comprises, and/or consists essentially of, a dielectric material selected from undoped silicate glass, a doped silicate glass, and organosilicate glass; and all sidewalls of the semiconductor plate 702 contact the substrate dielectric matrix 703.

In one embodiment, the second substrate 708 comprises a backside silicon oxide layer 706 contacting a backside surface of the semiconductor plate 702 and contacting a backside surface of the substrate dielectric matrix 703; and the second silicon oxide surface is a backside surface of the backside silicon oxide layer 706.

The methods of the present disclosure use oxide-to-oxide bonding to bond two dies, or a first wafer including a plurality of first semiconductor dies and a second wafer including a plurality of second semiconductor dies. Metal bonding pads (e.g., copper to copper) are not necessary at the bonding interface, and thus, there is no concern for dishing of metal pads or reduction of contact area between metal pads having non-planar surfaces. Through silicon via (TSV) structures utilized in prior art structures may be omitted in some embodiments, and aluminum pad processes may be used to form the external bonding pads 786. Cost reduction and enhancement of reliability of inter-die electrical connection may be achieved by the methods of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
a first semiconductor die comprising a first substrate, first semiconductor devices overlying the first substrate, first dielectric material layers overlying the first semiconductor devices and having a first silicon oxide surface as an uppermost surface, and first metal interconnect structures formed within the first dielectric material layers;
a second semiconductor die overlying the first semiconductor die, and comprising a second substrate that comprises a combination of a semiconductor plate and a substrate dielectric matrix that has a top surface within a first horizontal plane including a top surface of the semiconductor plate and has a bottom surface within a second horizontal plane including a bottom surface of the semiconductor plate, second semiconductor devices overlying a top surface of the semiconductor plate second dielectric material layers overlying the second semiconductor devices, and second metal interconnect structures formed within the second dielectric material layers, wherein a second silicon oxide surface of the second semiconductor die is located underneath the second substrate and is bonded to the first silicon oxide surface of the first semiconductor die at an oxide-to-oxide bonding interface; and
inter-die connection via structures vertically extending through the substrate dielectric matrix and the oxide-to-oxide bonding interface, contacting a top surface of a respective first metal pad structure selected from the first metal interconnect structures, and contacting a bottom surface of a respective second metal pad structure selected from the second metal interconnect structures.

2. The bonded assembly of claim 1, further comprising:
an external bonding pad overlying, and electrically connected to, one of the second metal pad structures; and
a solder material portion bonded to the external bonding pad.

3. The bonded assembly of claim 1, wherein:
the semiconductor plate consists essentially of a semiconductor material; and
the substrate dielectric matrix laterally surrounds the semiconductor plate.

4. The bonded assembly of claim 3, wherein the inter-die connection via structures vertically extend through the substrate dielectric matrix and do not extend through the semiconductor plate.

5. The bonded assembly of claim 4, wherein:
the semiconductor plate has a maximum thickness in a range from 0.5 micron to 60 microns; and
the substrate dielectric matrix has a maximum thickness in a range from 0.5 micron to 60 microns; and
the maximum thickness of the semiconductor plate is the same as the maximum thickness of the substrate dielectric matrix.

6. The bonded assembly of claim 5, wherein: the second semiconductor devices comprise field effect transistors located on the top surface of the semiconductor plate and including respective transistor active regions formed in an upper portion of the semiconductor plate;
the field effect transistors are electrically isolated from one another by shallow trench isolation structures formed in the upper portion of the semiconductor plate; and a maximum thickness of the shallow trench isolation structures is less than the maximum thickness of the semiconductor plate.

7. The bonded assembly of claim 4, wherein:

the substrate dielectric matrix comprises a dielectric material selected from undoped silicate glass, a doped silicate glass, and organosilicate glass; and all sidewalls of the semiconductor plate contact the substrate dielectric matrix.

8. The bonded assembly of claim 3, wherein:

the second substrate comprises a backside silicon oxide layer contacting a backside surface of the semiconductor plate and contacting a backside surface of the substrate dielectric matrix; and the second silicon oxide surface is a backside surface of the backside silicon oxide layer.

9. The bonded assembly of claim 1, wherein each sidewall of the inter-die connection via structures vertically extends straight from the top surface of the respective first metal pad structure selected from the first metal interconnect structures to the bottom surface of the respective second metal pad structure.

10. The bonded assembly of claim 1, wherein:

the first semiconductor die comprises a memory die including a three-dimensional array of memory elements; and the second semiconductor die comprises a support die including a peripheral circuitry configured to control the three-dimensional array of memory elements as the second semiconductor devices.

11. The bonded assembly of claim 6, further comprising shallow trench isolation structures embedded within the semiconductor plate and laterally surrounding a respective one of the field effect transistors.

12. The bonded assembly of claim 11, wherein:

top surfaces of the shallow trench isolation structures are located within the first horizontal plane; and bottom surfaces of the shallow trench isolation structure are located entirely within the semiconductor plate and are vertically spaced from the second horizontal plane.

13. The bonded assembly of claim 1, wherein all sidewalls of the semiconductor plate contact the substrate dielectric matrix.

14. The bonded assembly of claim 1, wherein top surfaces of the inter-die connection via structures are located within a third horizontal plane including top surfaces of a first subset of the second metal interconnect structures.

15. The bonded assembly of claim 14, wherein the first subset of the second metal interconnect structures is electrically connected to a respective one of the second semiconductor devices through an additional subset of the second metal interconnect structures that underlie the first subset of the second metal interconnect structures.

16. The bonded assembly of claim 14, wherein a second subset of the second metal interconnect structures contacting a top surface of a respective one of the inter-die connection via structures and contacting a top surface of a respective second metal interconnect structure within the first subset of the second metal interconnect structures.

17. The bonded assembly of claim 14, wherein the inter-die connection via structures have a vertical extent that is greater than a vertical distance between the second horizontal plane and the third horizontal plane.

18. The bonded assembly of claim 1, wherein sidewalls of the inter-die connection via structures are in direct contact with the substrate dielectric matrix.

19. The bonded assembly of claim 1, wherein sidewalls of the inter-die connection via structures are in direct contact with the second dielectric material layers.

20. The bonded assembly of claim 1, further comprising:

a source-side dielectric material layer located on a top surface of the first substrate; and a source semiconductor layer overlying the source-side dielectric material layer, wherein the first semiconductor devices are located on a top surface of the source semiconductor layer.

* * * * *